US 12,125,797 B2

(12) United States Patent
Chen et al.

(10) Patent No.: US 12,125,797 B2
(45) Date of Patent: *Oct. 22, 2024

(54) PACKAGE STRUCTURE WITH FAN-OUT FEATURE

(71) Applicant: Taiwan Semiconductor Manufacturing Company, Ltd., Hsinchu (TW)

(72) Inventors: Shing-Chao Chen, Zhubei (TW); Chih-Wei Lin, Zhubei (TW); Tsung-Hsien Chiang, Hsinchu (TW); Ming-Da Cheng, Taoyuan (TW); Ching-Hua Hsieh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 27 days.

This patent is subject to a terminal disclaimer.

(21) Appl. No.: 17/856,154

(22) Filed: Jul. 1, 2022

(65) Prior Publication Data

US 2022/0336363 A1 Oct. 20, 2022

Related U.S. Application Data

(60) Continuation of application No. 16/725,352, filed on Dec. 23, 2019, now Pat. No. 11,404,381, which is a
(Continued)

(51) Int. Cl.
*H01L 23/538* (2006.01)
*H01L 21/48* (2006.01)
(Continued)

(52) U.S. Cl.
CPC ...... *H01L 23/5386* (2013.01); *H01L 21/4857* (2013.01); *H01L 21/486* (2013.01);
(Continued)

(58) Field of Classification Search
None
See application file for complete search history.

(56) References Cited

U.S. PATENT DOCUMENTS 8,361,842 B2   1/2013   Yu et al.
8,680,647 B2   3/2014   Yu et al.
(Continued)

OTHER PUBLICATIONS

Non-Final Office Action dated Jan. 20, 2023, issued in U.S. Appl. No. 17/328,925 (copy not provided).
(Continued)

*Primary Examiner* — Hung K Vu
(74) *Attorney, Agent, or Firm* — McClure, Qualey & Rodack, LLP

(57) ABSTRACT

A package structure is provided. The package structure includes a semiconductor chip and a first dielectric layer over the semiconductor chip and extending across opposite sidewalls of the semiconductor chip. The package structure also includes a conductive layer over the first dielectric layer, and the conductive layer has multiple first protruding portions extending into the first dielectric layer. The package structure further includes a second dielectric layer over the first dielectric layer and the conductive layer. The second dielectric layer has multiple second protruding portions extending into the first dielectric layer. Each of the first protruding portions and the second protruding portions is thinner than the first dielectric layer.

20 Claims, 24 Drawing Sheets

Related U.S. Application Data continuation of application No. 16/222,047, filed on Dec. 17, 2018, now Pat. No. 10,515,900, which is a division of application No. 15/292,762, filed on Oct. 13, 2016, now Pat. No. 10,157,846.

(51) Int. Cl.

| | | |
|---|---|---|
| *H01L 21/56* | (2006.01) | |
| *H01L 21/683* | (2006.01) | |
| *H01L 23/00* | (2006.01) | |
| *H01L 25/065* | (2023.01) | |
| H01L 23/31 | (2006.01) | |
| H01L 23/498 | (2006.01) | |
| H01L 25/00 | (2006.01) | |
| H01L 25/10 | (2006.01) | |

(52) U.S. Cl.
CPC .......... *H01L 21/561* (2013.01); *H01L 21/566* (2013.01); *H01L 21/6835* (2013.01); *H01L 23/5383* (2013.01); *H01L 23/5384* (2013.01); *H01L 23/5389* (2013.01); *H01L 24/18* (2013.01); *H01L 24/19* (2013.01); *H01L 24/20* (2013.01); *H01L 25/0657* (2013.01); H01L 21/568 (2013.01); H01L 23/3128 (2013.01); H01L 23/49816 (2013.01); H01L 23/49827 (2013.01); H01L 25/105 (2013.01); H01L 25/50 (2013.01); H01L 2221/68345 (2013.01); H01L 2221/68359 (2013.01); H01L 2221/68372 (2013.01); H01L 2221/68381 (2013.01); H01L 2224/04105 (2013.01); H01L 2224/12105 (2013.01); H01L 2224/16227 (2013.01); H01L 2224/18 (2013.01); H01L 2224/24227 (2013.01); H01L 2224/32225 (2013.01); H01L 2224/73267 (2013.01); H01L 2224/92244 (2013.01); H01L 2224/97 (2013.01); H01L 2225/1035 (2013.01); H01L 2225/1041 (2013.01); H01L 2225/1058 (2013.01); H01L 2924/1203 (2013.01); H01L *2924/1304* (2013.01); *H01L 2924/13091* (2013.01); *H01L 2924/1431* (2013.01)

(56) References Cited

U.S. PATENT DOCUMENTS

| | | |
|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,796,846 B2 | 8/2014 | Lin et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 10,515,900 B2 | 12/2019 | Chen et al. |
| 11,404,381 B2 * | 8/2022 | Chen .................. H01L 23/5383 |
| 2011/0291288 A1 | 12/2011 | Wu et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0200528 A1 * | 8/2013 | Lin ........................ H01L 24/97 |
| | | 257/774 |
| 2013/0264684 A1 | 10/2013 | Yu et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2016/0005909 A1 | 1/2016 | Newman |
| 2016/0056056 A1 | 2/2016 | Chen et al. |
| 2016/0056126 A1 | 2/2016 | Yu et al. |
| 2016/0148887 A1 | 5/2016 | Yu et al. |
| 2017/0005074 A1 | 1/2017 | Chen et al. |
| 2017/0250091 A1 | 8/2017 | Yu et al. |

OTHER PUBLICATIONS

Non-Final Office Action dated Aug. 3, 2023, issued in U.S. Appl. No. 17/328,925 (copy not provided).

* cited by examiner

PACKAGE STRUCTURE WITH FAN-OUT FEATURE

PRIORITY CLAIM AND CROSS-REFERENCE

This application is a Continuation application of U.S. patent application Ser. No. 16/725,352, filed on Dec. 23, 2019 (now U.S. Pat. No. 11,404,381, issued on Aug. 2, 2022), which is a Continuation application of U.S. patent application Ser. No. 16/222,047, filed on Dec. 17, 2018 (now U.S. Pat. No. 10,515,900, issued on Dec. 24, 2019), which is a Divisional of U.S. application Ser. No. 15/292,762, filed on Oct. 13, 2016 (now U.S. Pat. No. 10,157,846, issued on Dec. 18, 2018), the entirety of which are incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. One smaller type of packaging for semiconductor devices is a chip-scale package (CSP), in which a semiconductor die is placed on a substrate.

New packaging technologies have been developed to further improve the density and functions of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-2 to 2C-2 are top views of various stages of a process for forming a chip package, in accordance with some embodiments.

DETAILED DESCRIPTION

Figure 1A:
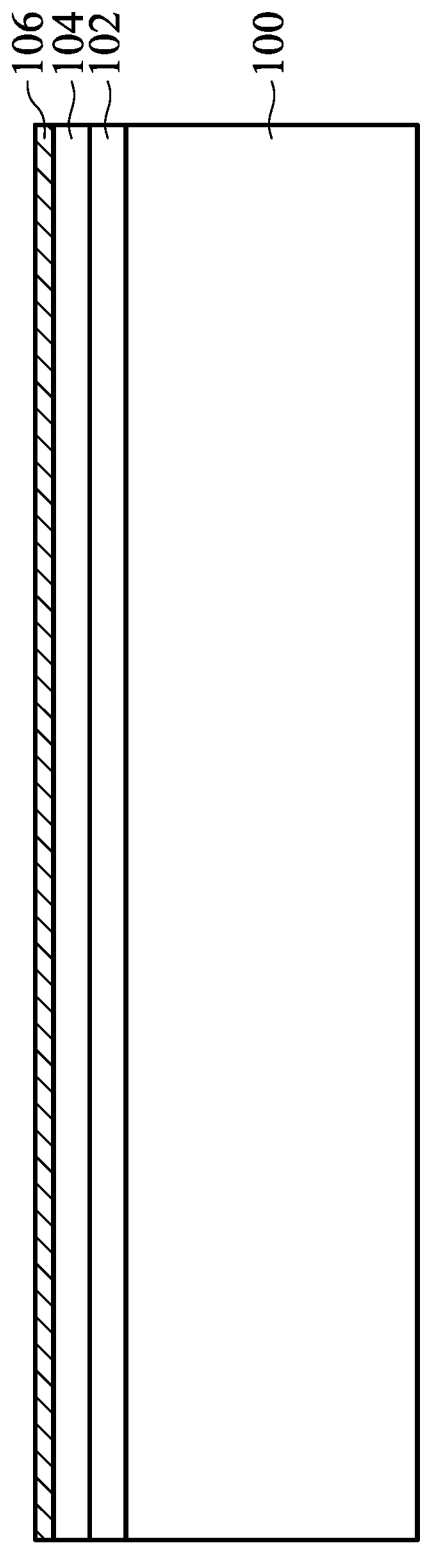
FIGS. 1A-1N are cross-sectional views of various stages of a process for forming a chip package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1B:
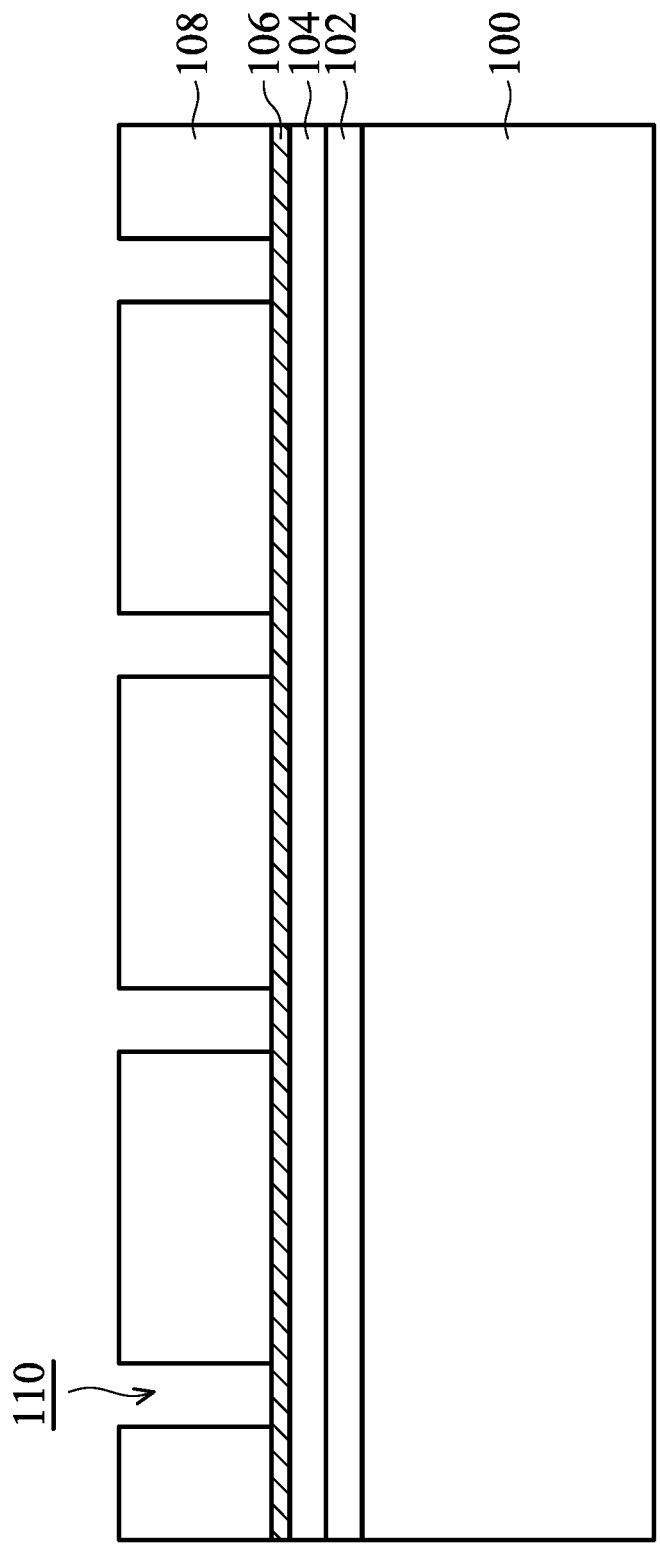
FIGS. 2A-1 to 2C-1 are cross-sectional views of various stages of a process for forming a chip package, in accordance with some embodiments.
Figure 1C:
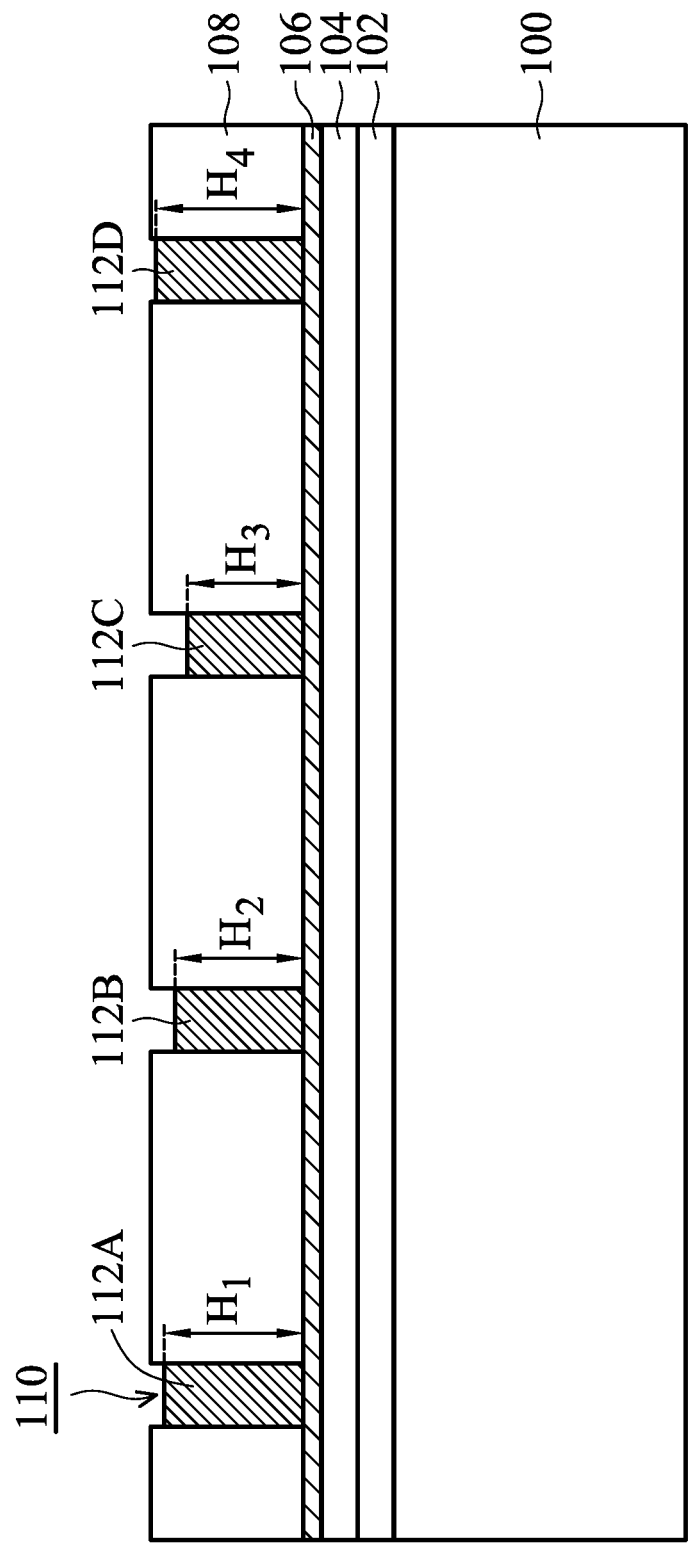
Figure 1D:
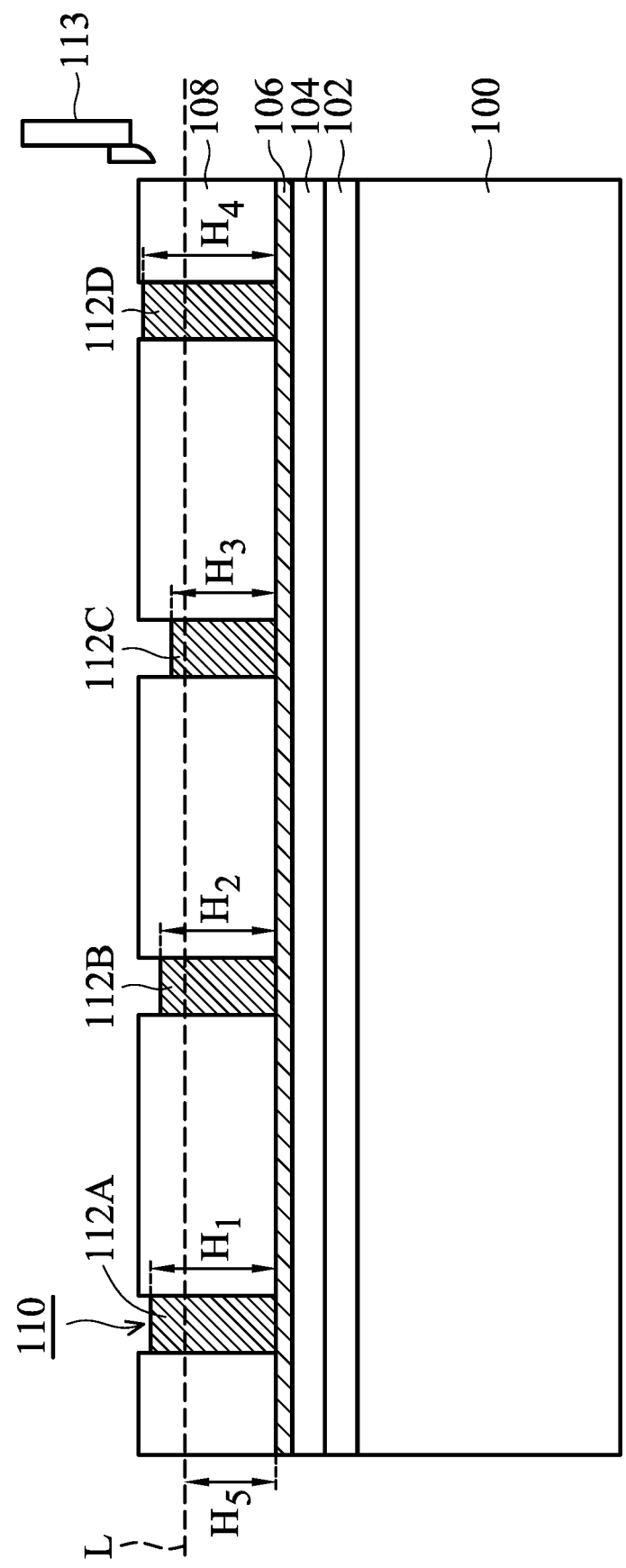
Figure 1E:
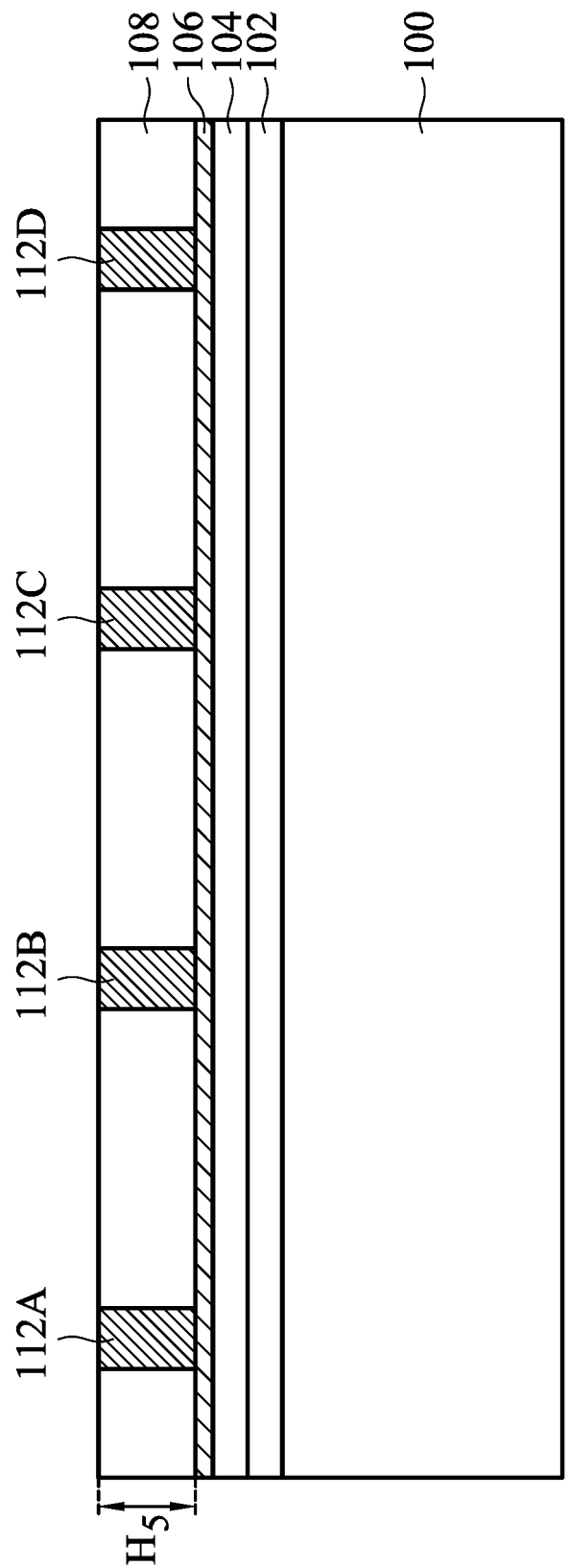
Figure 1F:
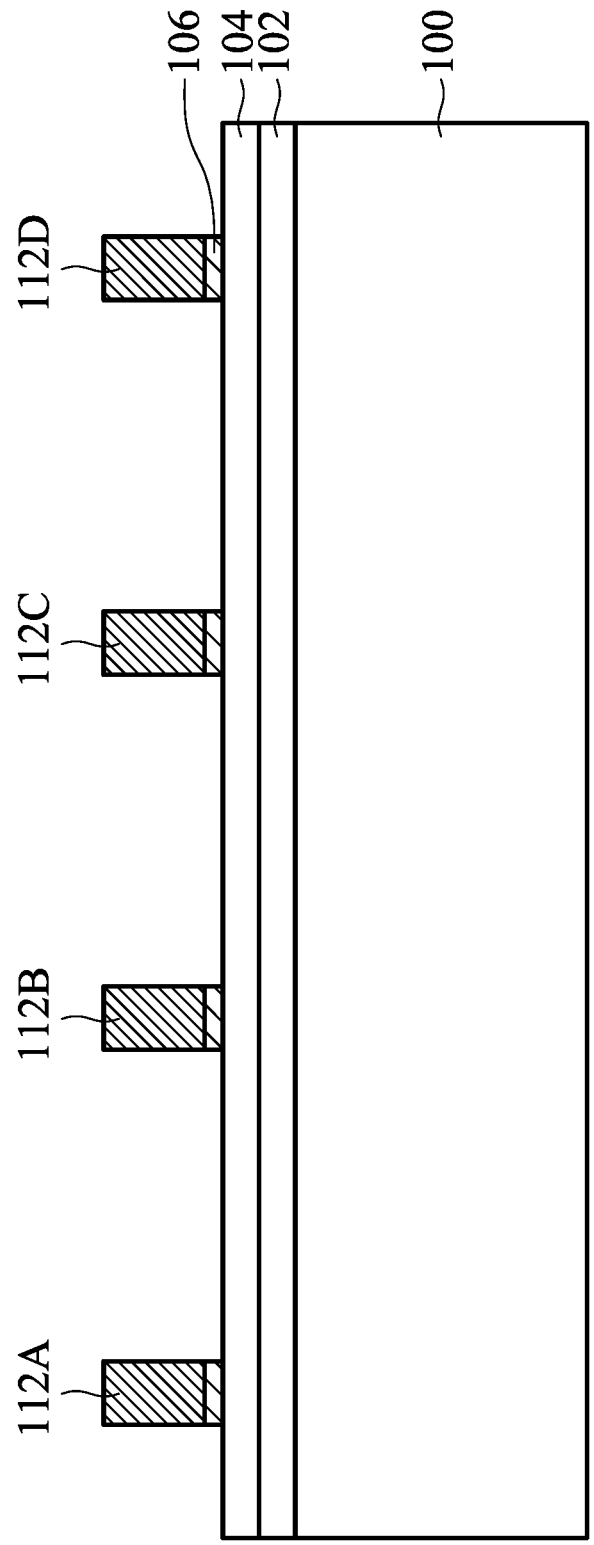
Figure 1G:
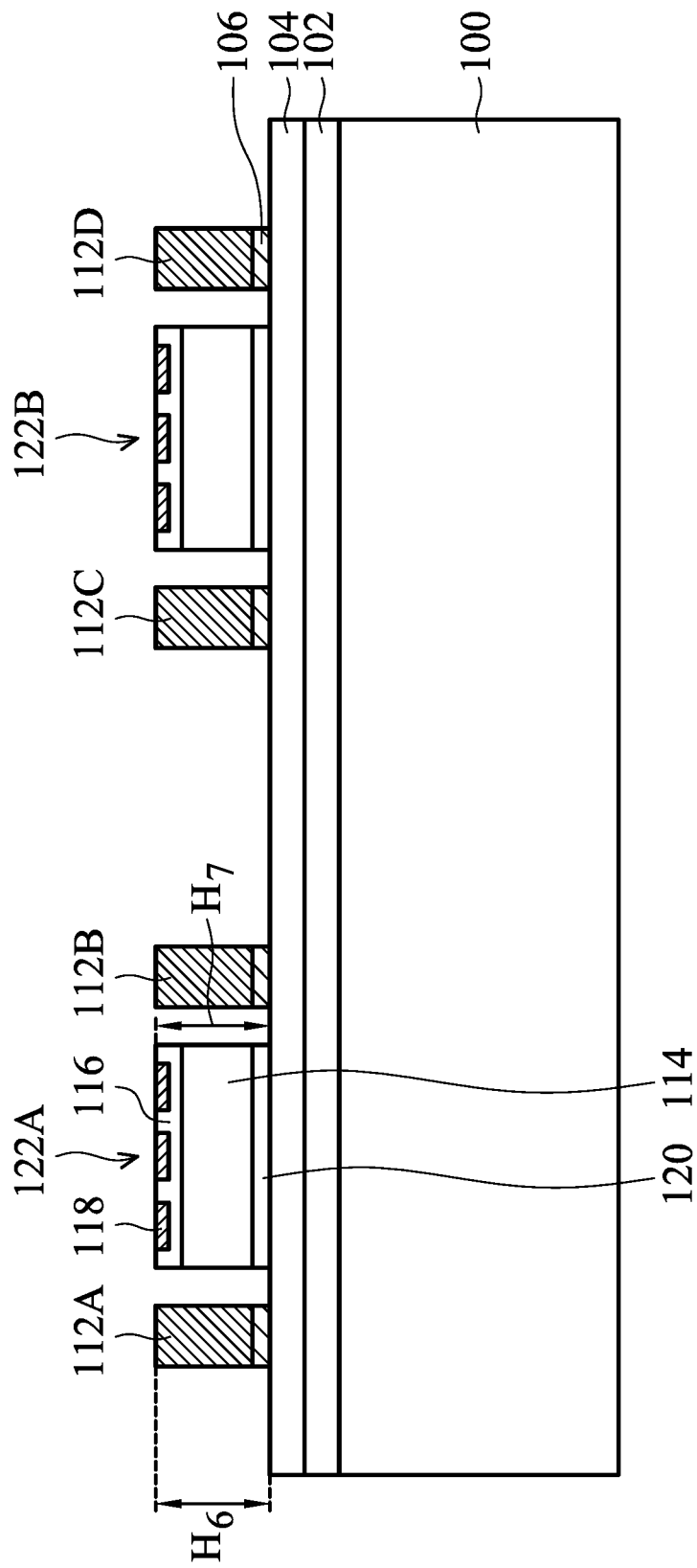
Figure 1H:
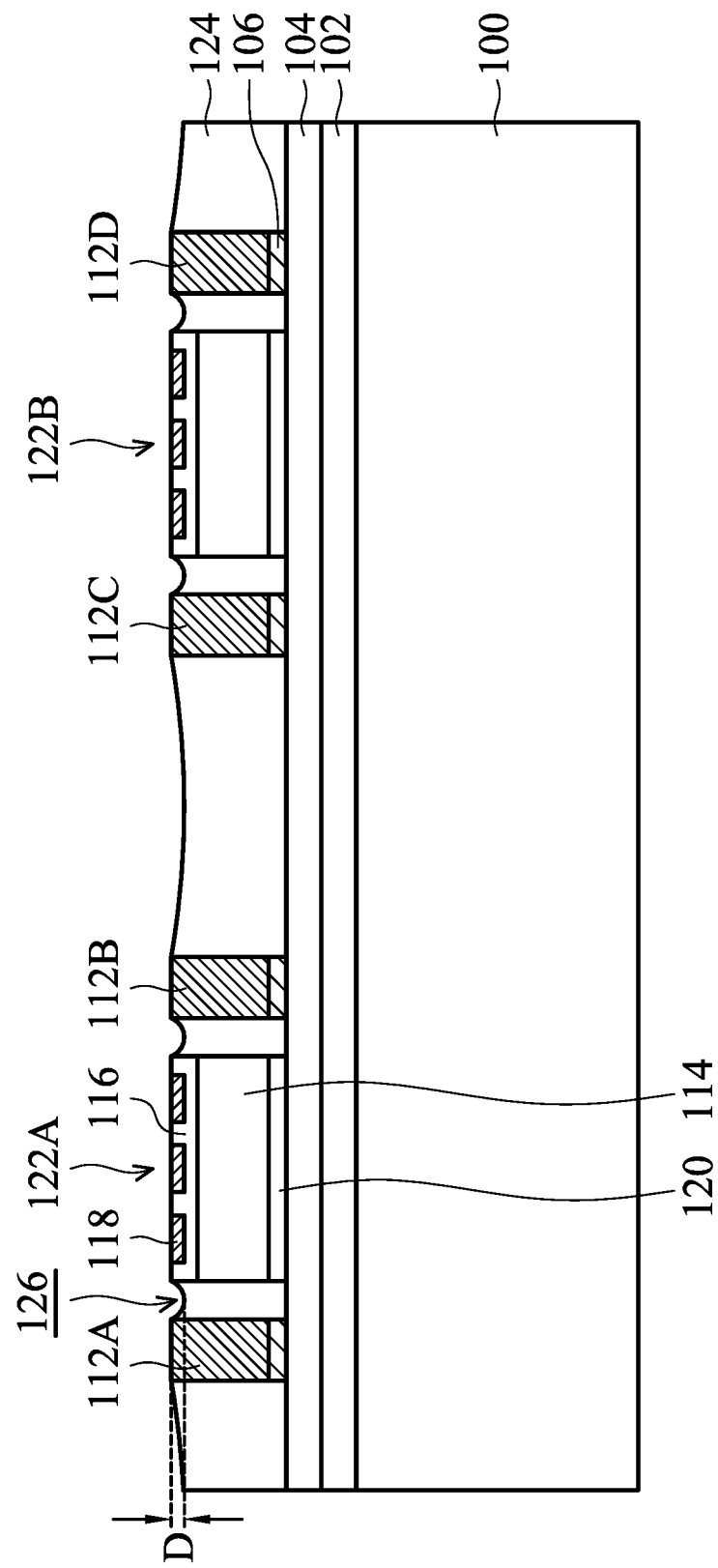
Figure 1I:
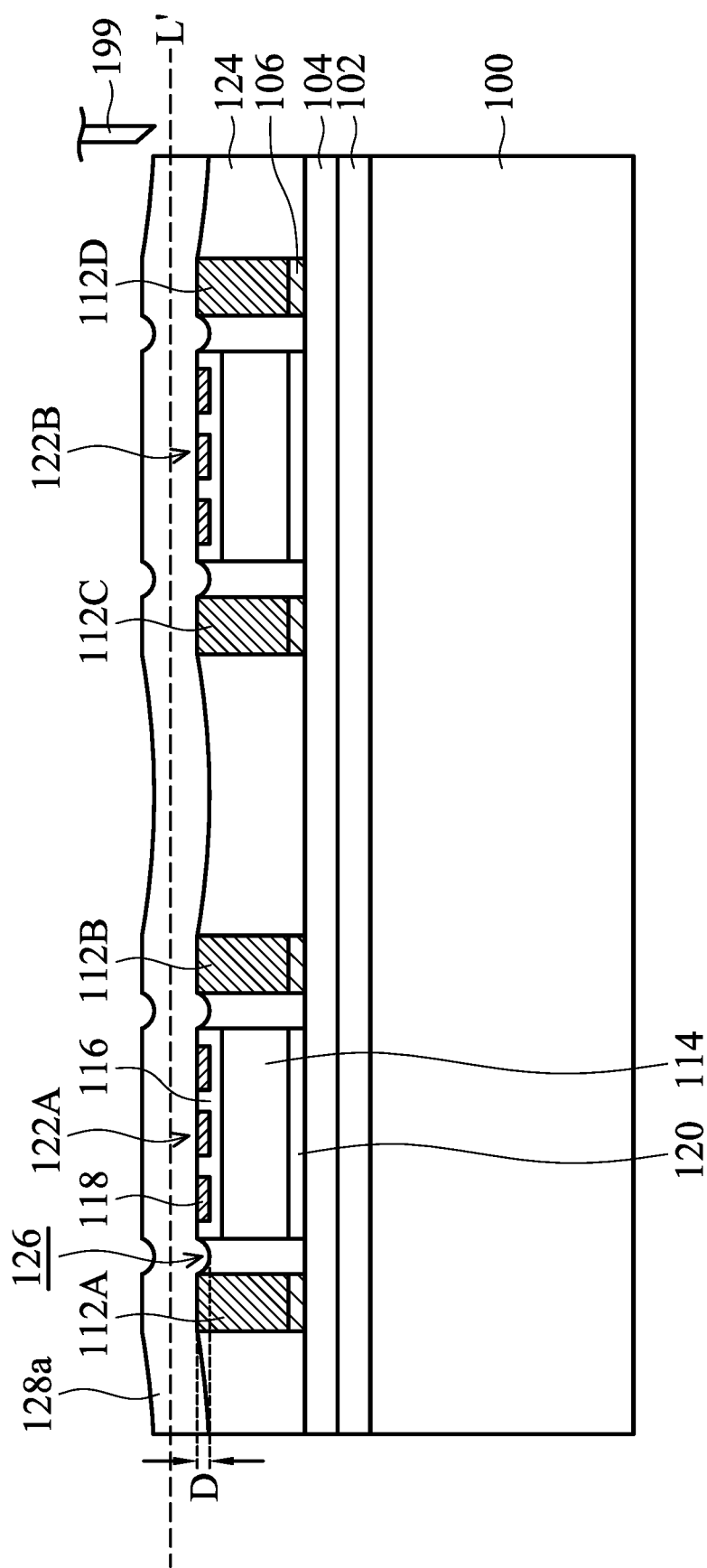
Figure 1J:
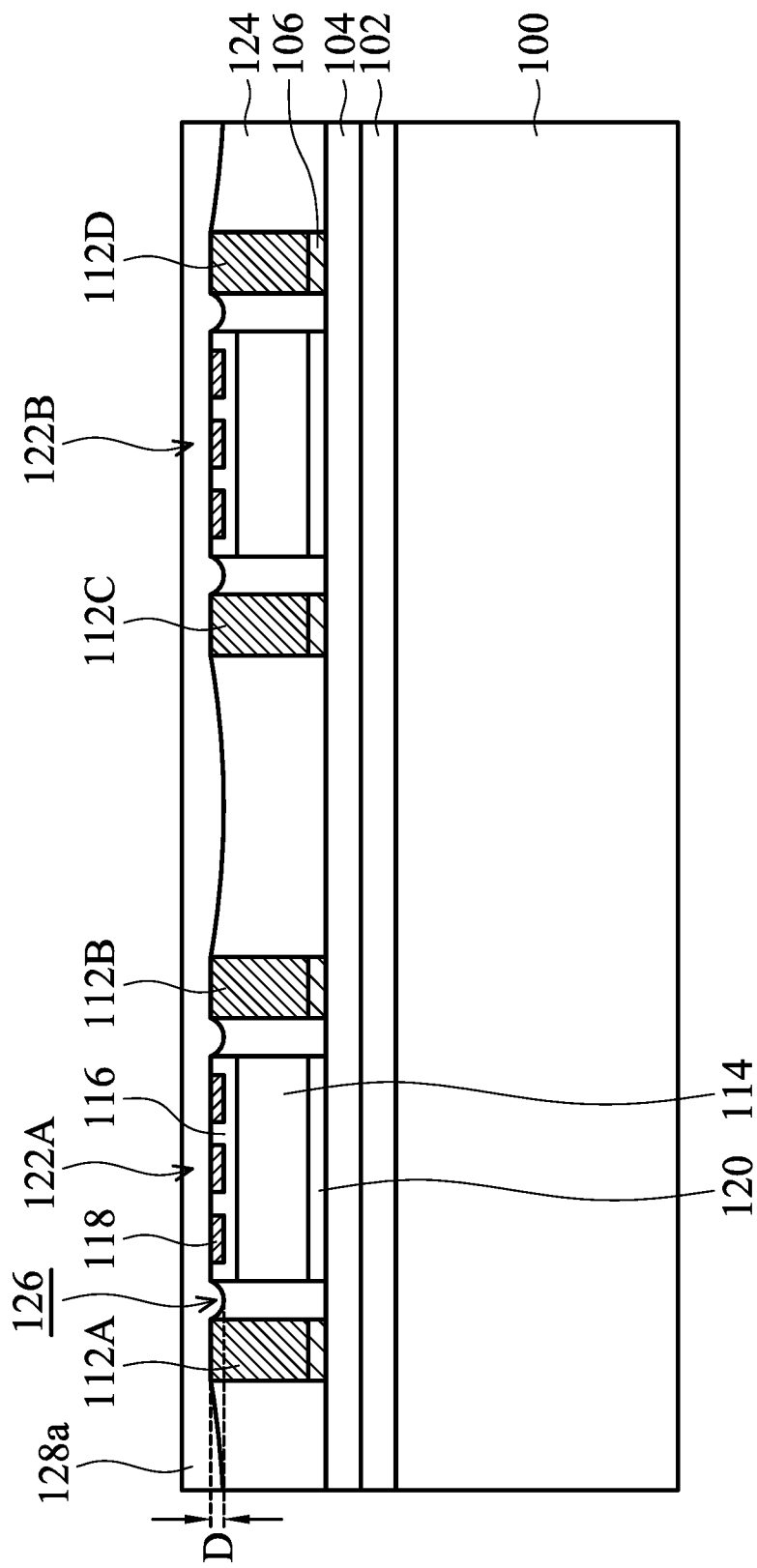
Figure 1K:
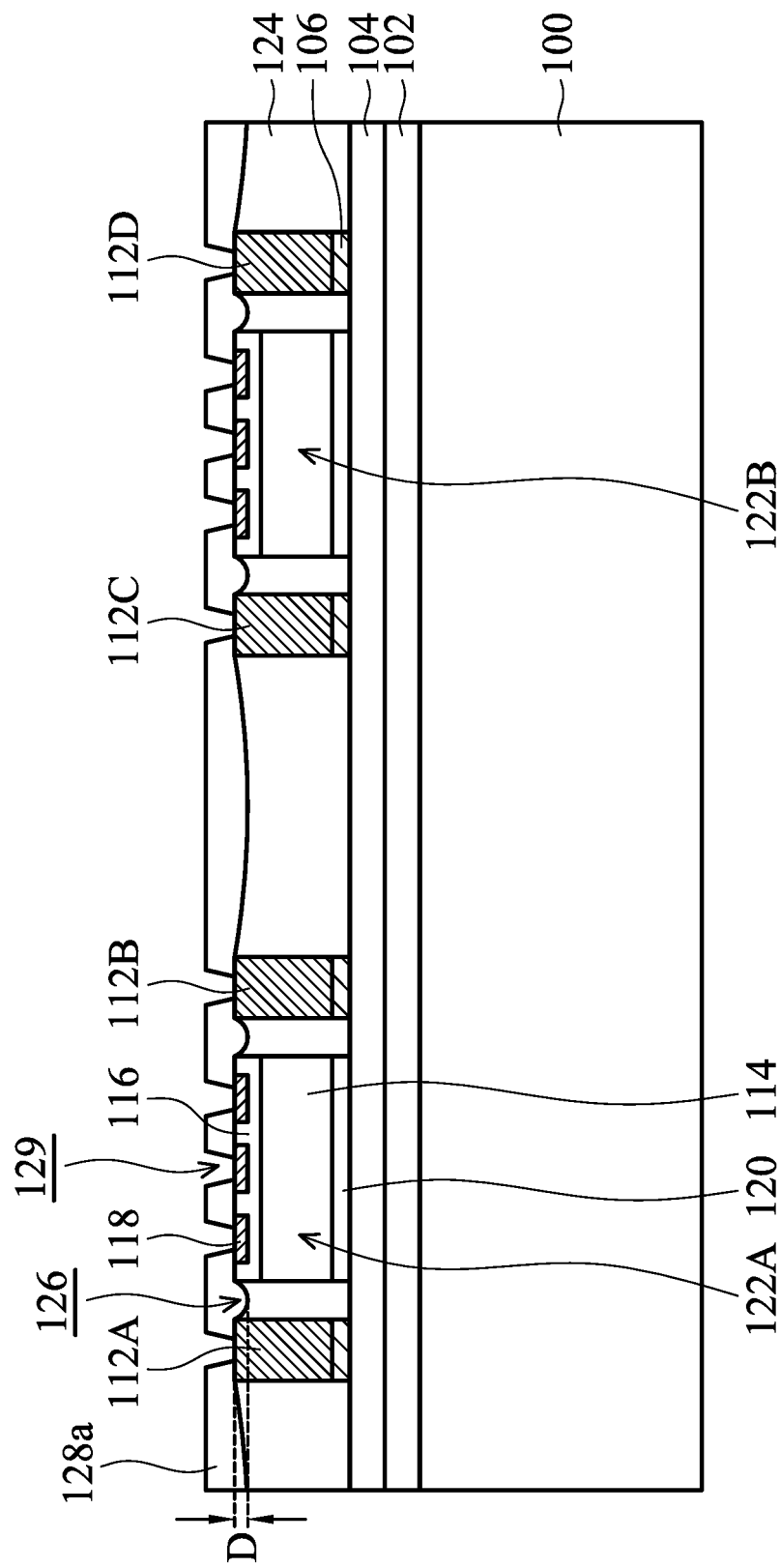
Figure 1L:
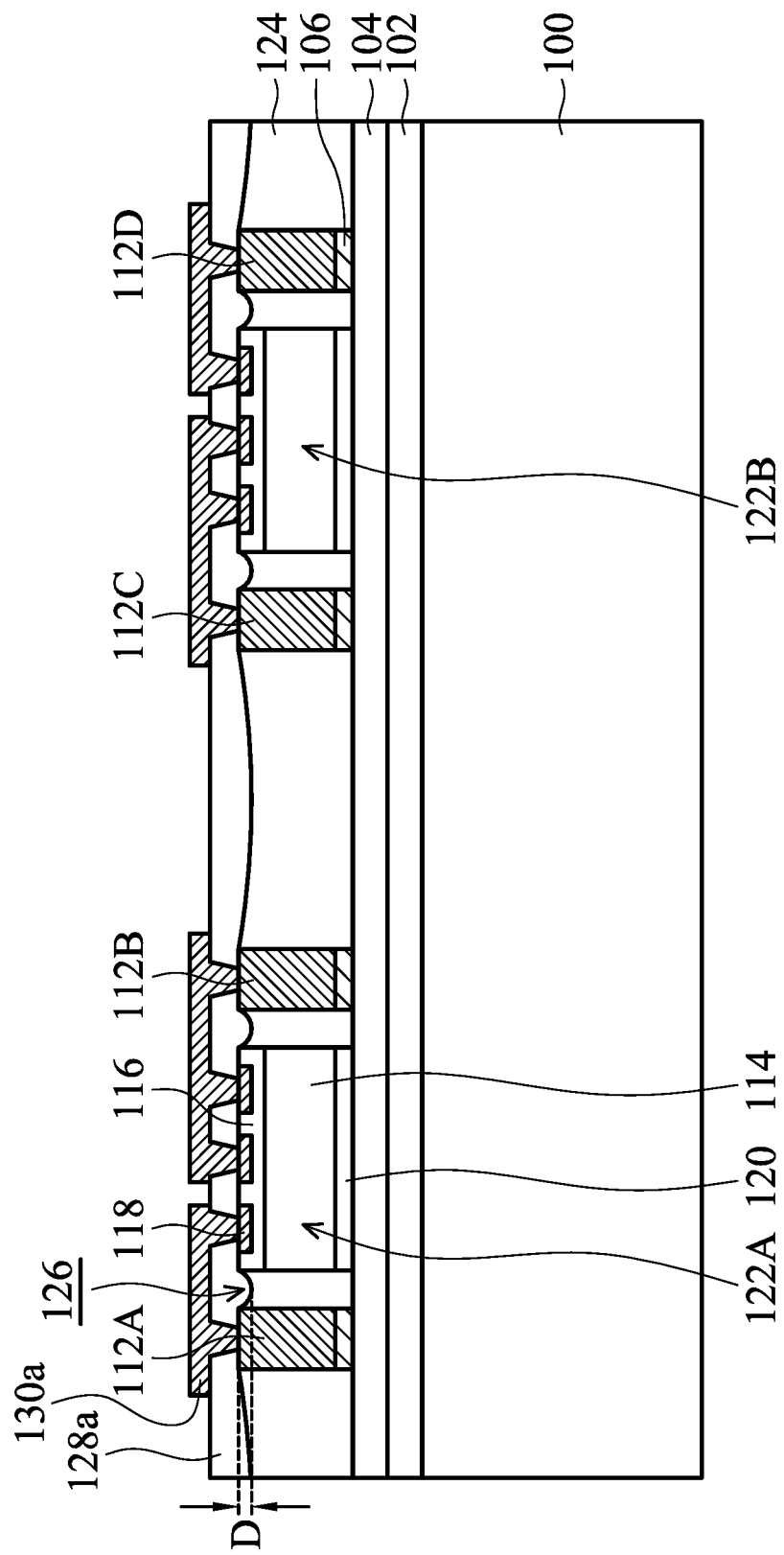
Figure 1M:
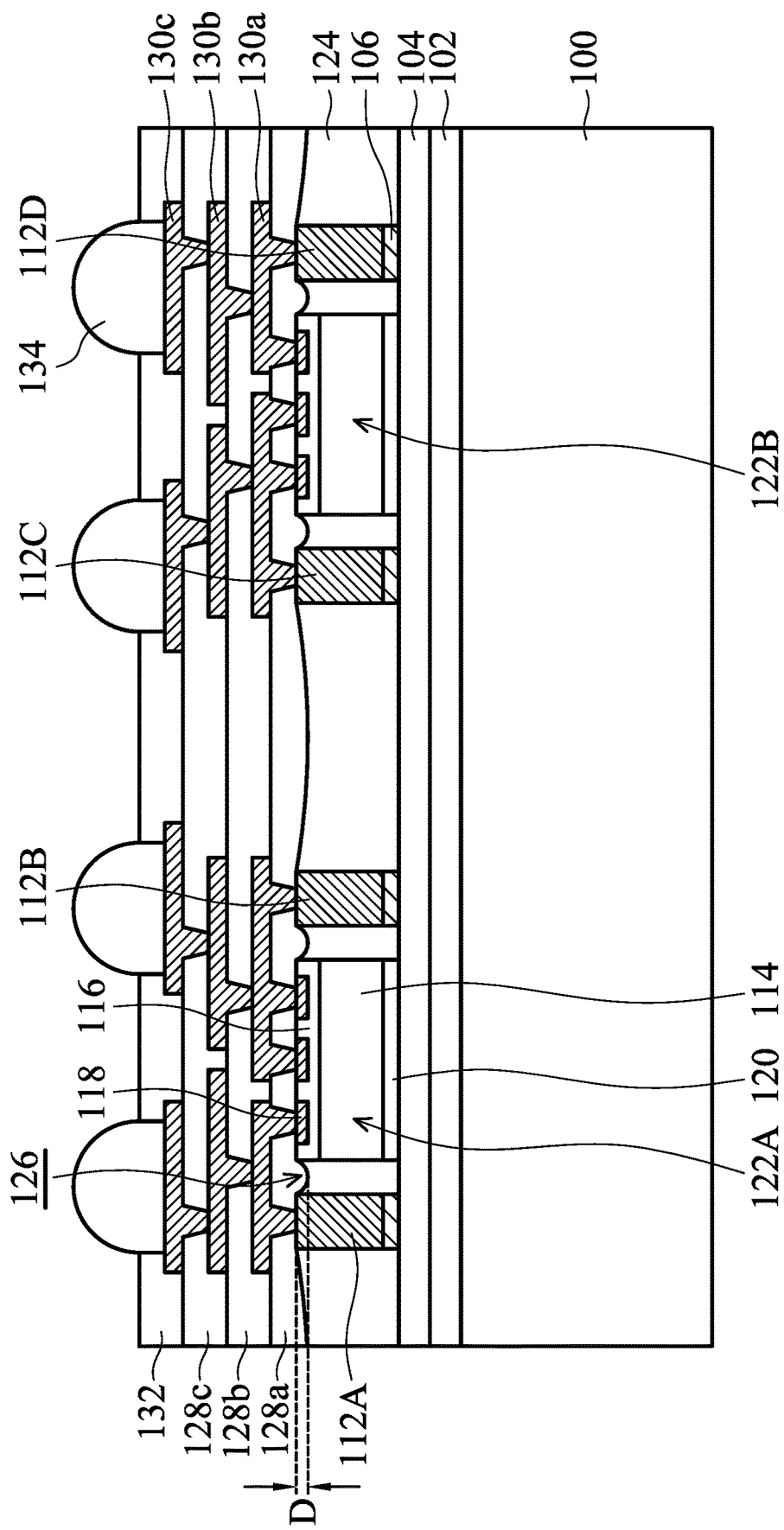
Figure 1N:
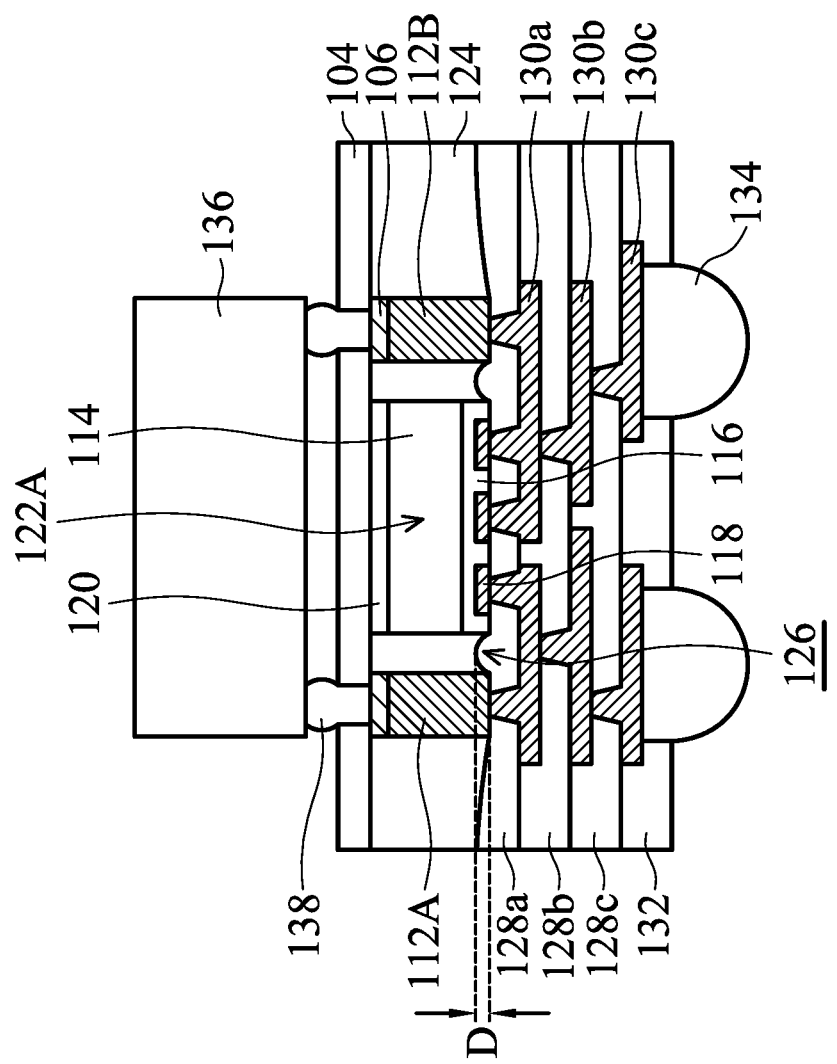

FIGS. 1A-1N are cross-sectional views of various stages of a process for forming a chip package, in accordance with some embodiments. As shown in FIG. 1A, an adhesive layer 102 and a base layer 104 are deposited or laminated over a carrier substrate 100, in accordance with some embodiments. In some embodiments, the carrier substrate 100 is used as a temporary support substrate. The carrier substrate 100 may be made of a semiconductor material, ceramic material, polymer material, metal material, another suitable material, or a combination thereof. In some embodiments, the carrier substrate 100 is a glass substrate. In some other embodiments, the carrier substrate 100 is a semiconductor substrate, such as a silicon wafer.

The adhesive layer 102 may be made of glue, or may be a lamination material, such as a foil. In some embodiments, the adhesive layer 102 is photosensitive and is easily detached from the carrier substrate 100 by light irradiation. For example, shining ultra-violet (UV) light or laser light on the carrier substrate 100 is used to detach the adhesive layer 102. In some embodiments, the adhesive layer 102 is a light-to-heat-conversion (LTHC) coating. In some other embodiments, the adhesive layer 102 is heat-sensitive. The adhesive layer 102 may be detached using a thermal operation.

In some embodiments, the base layer 104 is a polymer layer or a polymer-containing layer. The base layer 104 may be a polybenzoxazole (PBO) layer, a polyimide (PI) layer, a solder resist (SR) layer, an Ajinomoto buildup film (ABF), a die attach film (DAF), another suitable layer, or a combination thereof. In some embodiments, the base layer 104 includes multiple sub-layers. In some other embodiments, the base layer 104 is not formed.

Afterwards, a seed layer 106 is deposited over the base layer 104, as shown in FIG. 1A in accordance with some embodiments. In some embodiments, the seed layer 106 is made of a metal material, such as copper or titanium. In some embodiments, the seed layer 106 is deposited using a physical vapor deposition (PVD) process, a chemical vapor deposition (CVD) process, a spin-on process, another applicable process, or a combination thereof. In some embodiments, the seed layer 106 may be made of Ti, Ti alloy, Cu, Cu alloy, another suitable material, or a combination thereof. The Ti alloy or the Cu alloy may include silver, chromium, nickel, tin, gold, tungsten, another suitable element, or a combination thereof. In some embodiments, the seed layer 106 includes multiple sub-layers.

Many variations and/or modifications can be made to embodiments of the disclosure. In some other embodiments, the seed layer 106 is not formed.

As shown in FIG. 1B, a mask layer 108 is formed over the seed layer 106, in accordance with some embodiments. The mask layer 108 has multiple openings 110 that expose portions of the seed layer 106. The openings 110 of the mask layer 108 define the positions where conductive structures, such as through package vias, will be formed. In some embodiments, the mask layer 108 is made of a photoresist material. The openings of the mask layer 108 may be formed by a photolithography process. The photolithography process may include exposure and development operations.

As shown in FIG. 1C, conductive structures including conductive structures 112A, 112B, 112C, and 112D are formed in the openings 110 of the mask layer 108, in accordance with some embodiments. In some embodiments, the conductive structures 112A, 112B, 112C, and 112D include conductive pillars. In some embodiments, each of the conductive structures 112A, 112B, 112C, and 112D has a linear sidewall. In some embodiments, the sidewalls of the conductive structures 112A, 112B, 112C, and 112D are substantially perpendicular to the surface of the seed layer 106. In some embodiments, a top view of each of the conductive structures 112A, 112B, 112C, and 112D is substantially circular. In some embodiments, widths of the conductive structures 112A, 112B, 112C, and 112D are substantially the same. In some other embodiments, widths of some of the conductive structures 112A, 112B, 112C, and 112D are different from each other.

In some embodiments, the conductive structures 112A, 112B, 112C, and 112D are made of a metal material. The metal material may include Cu, Ti, Au, Co, Al, W, another suitable material, or a combination thereof. In some embodiments, the conductive structures 112A, 112B, 112C, and 112D are made of a solder material that includes Sn. In some other embodiments, the conductive structures 112A, 112B, 112C, and 112D are made of a metal material that does not include Sn.

In some embodiments, the conductive structures 112A, 112B, 112C, and 112D are formed using a plating process. The plating process may include an electroplating process, an electroless plating process, another applicable process, or a combination thereof. However, many variations and/or modifications can be made to embodiments of the disclosure. In some other embodiments, the conductive structures 112A, 112B, 112C, and 112D are formed using a chemical vapor deposition (CVD) process, a physical vapor deposition (PVD) process, a spin-on process, another applicable process, or a combination thereof.

In some embodiments, the conductive structures 112A, 112B, 112C, and 112D are substantially as high as each other. However, embodiments of the disclosure are not limited thereto. In some other embodiments, one or more of these conductive structures have a height different from that of other conductive structures. As shown in FIG. 1C, the conductive structures 112A, 112B, 112C, and 112D have heights $H_1$, $H_2$, $H_3$, and $H_4$, respectively. In some embodiments, the heights $H_1$, $H_2$, $H_3$, and $H_4$ are substantially the same. In some embodiments, some of the heights $H_1$, $H_2$, $H_3$, and $H_4$ are different from each other, as shown in FIG. 1C.

As shown in FIG. 1D, a cutting tool 113 is used to cut (mechanically trim) the upper portions of the conductive structures 112A, 112B, 112C, and 112D, in accordance with some embodiments. The upper portions of the conductive structures 112A, 112B, 112C, and 112D above an imaginary line L will be shaved off by the cutting tool 113. The imaginary line L may be set at a level that allows each of the conductive structures 112A, 112B, 112C, and 112D to have a height of $H_5$ after being cut. In some embodiments, an upper portion of the mask layer 108 above the imaginary line L and the upper portions of the conductive structures 112A, 112B, 112C, and 112D are cut together using the cutting tool 113.

As shown in FIG. 1E, after the cutting operation, the top surfaces of the conductive structures 112A, 112B, 112C, and 112D are substantially coplanar with each other, in accordance with some embodiments. Each of the conductive structures 112A, 112B, 112C, and 112D has a height of $H_5$. In some embodiments, due to the cutting operation, the conductive structures 112A, 112B, 112C, and 112D that originally had different heights now have substantially the same height. In some embodiments, scratches may be left at the top surfaces of the conductive structures 112A, 112B, 112C, and 112D after being cut by the cutting tool 113. The scratches are formed by the cutting tool 113.

Even if the conductive structures 112A, 112B, 112C, and 112D do not have the same height after deposition (e.g., through plating, CVD, or other suitable forming methods), the cutting operation ensures the conductive structures 112A, 112B, 112C, and 112D to have substantially the same height. The top surfaces of the conductive structures 112A, 112B, 112C, and 112D are substantially coplanar, which facilitates subsequent processes. In some cases, the plating process for forming the conductive structures 112A, 112B, 112C, and 112D may not be required to be performed in a very well controlled manner. In some embodiments, the plating process is performed at a relatively high speed. Accordingly, the cutting (mechanical trimming) operation enables the use of less expensive plating solution during fabrication process. Therefore, the process cost and time are significantly reduced.

As shown in FIG. 1F, the mask layer 108 is removed, in accordance with some embodiments. Afterwards, the exposed portion of the seed layer 106 (not covered by the conductive structures including 112A, 112B, 112C, and 112D) are removed, as shown in FIG. 1F in accordance with some embodiments. An etching process may be used to partially remove the seed layer 106. The conductive structures including 112A, 112B, 112C, and 112D may function as an etching mask during the etching of the seed layer 106.

As shown in FIG. 1G, semiconductor dies including semiconductor dies 122A and 122B are attached on the base layer 104, in accordance with some embodiments. In some embodiments, the back sides of the semiconductor dies 122A and 122B face the base layer 104 with the front sides of the semiconductor dies 122A and 122B facing upwards. An adhesive film 120 may be used to fix the semiconductor dies 122A and 122B on the base layer 104. The adhesive film 120 may include a die attach film (DAF), a glue, or another suitable film.

Each of the semiconductor dies 122A and 122B may include a semiconductor substrate 114, a dielectric layer 116, and conductive pads 118 at the front side of the semiconductor die. In some embodiments, various device elements are formed in the semiconductor substrate 114. Examples of the various device elements include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field effect transistors (PFETs/NFETs), etc.), diodes, or other suitable elements.

The device elements are interconnected to form integrated circuit devices through conductive features formed in the dielectric layer 116. The dielectric layer 116 may include multiple sub-layers. The conductive features may include multiple conductive lines, conductive contacts, and conductive vias. The integrated circuit devices include logic devices, memory devices (e.g., static random access memories, SRAMs), radio frequency (RF) devices, input/output (I/O) devices, system-on-chip (SoC) devices, other applicable types of devices, or a combination thereof. In some embodiments, the semiconductor die 122A or 122B is a system-on-chip (SoC) chip that includes multiple functions.

The conductive pads 118 may be wider portions of some of the conductive lines formed on the dielectric layer 116 or embedded in the dielectric layer 116. Therefore, the device elements in the semiconductor substrate 114 may be electrically connected to other elements through the conductive pads 118 and other conductive features.

As shown in FIG. 1G, the seed layer 106 and each of the conductive structures 112A, 112B, 112C, and 112D together have a total height $H_6$. The adhesive film 120 and each of the semiconductor dies 122A and 122B together have a total height $H_7$. In some embodiments, the heights $H_6$ and $H_7$ are substantially the same.

However, many variations and/or modifications can be made to embodiments of the disclosure. In some embodiments, the heights $H_6$ and $H_7$ are different from each other. In some embodiments, the height $H_6$ is greater than the height $H_7$. In some embodiments, the height difference between one of the conductive structures 112A, 112B, 112C, and 112D and one of the semiconductor dies 122A and 122B is substantially equal to the difference between $H_6$ and $H_7$. In some embodiments, the height difference is in a range from about 2 μm to about 3 μm.

As shown in FIG. 1H, a protection layer 124 is formed over the carrier substrate 100 to surround the conductive structures 112A, 112B, 112C, and 112D and the semiconductor dies 122A and 122B, in accordance with some embodiments. In some embodiments, the protection layer 124 covers sidewalls of the conductive structures 112A, 112B, 112C, and 112D and the semiconductor dies 122A and 122B.

In some embodiments, the protection layer 124 exposes (or does not cover) the top surfaces of the conductive structures 112A, 112B, 112C, and 112D and the semiconductor dies 122A and 122B. In some embodiments, the conductive structures 112A, 112B, 112C, and 112D penetrate through the protection layer 124. The conductive structures 112A, 112B, 112C, and 112D are used as through package vias (TPVs) or through integrated fan-out vias (TIVs). In some embodiments, the protection layer 124 includes a polymer material. In some embodiments, the protection layer 124 includes a molding compound material. The molding compound material may include an epoxy-based resin with fillers dispersed therein.

In some embodiments, the protection layer 124 is formed by injecting a molding compound material over the carrier substrate 100. In some embodiments, after or during the injecting of the molding compound material, the molding compound material does not cover the top surfaces of the conductive structures 112A, 112B, 112C, and 112D and/or the semiconductor dies 122A and 122B.

In some embodiments, a liquid molding compound material is disposed over the carrier substrate 100 to encapsulate the conductive structures 112A, 112B, 112C, and 112D and the semiconductor dies 122A and 122B. In some embodiments, a thermal process is then applied to harden the liquid molding compound material and to transform it into the protection layer 124. In some embodiments, the thermal process is performed at a temperature in a range from about 200 degrees C. to about 230 degrees C. The operation time of the thermal process may be in a range from about 0.5 hour to about 3 hours.

Figures 1, 2A:
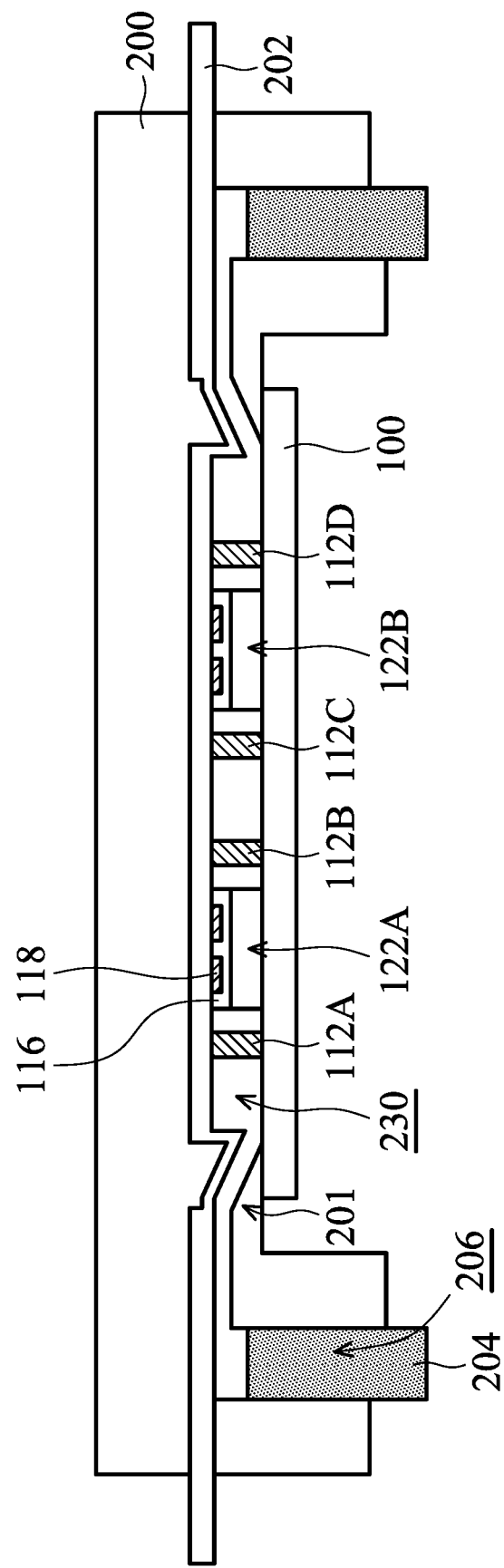
Figures 2, 2A:
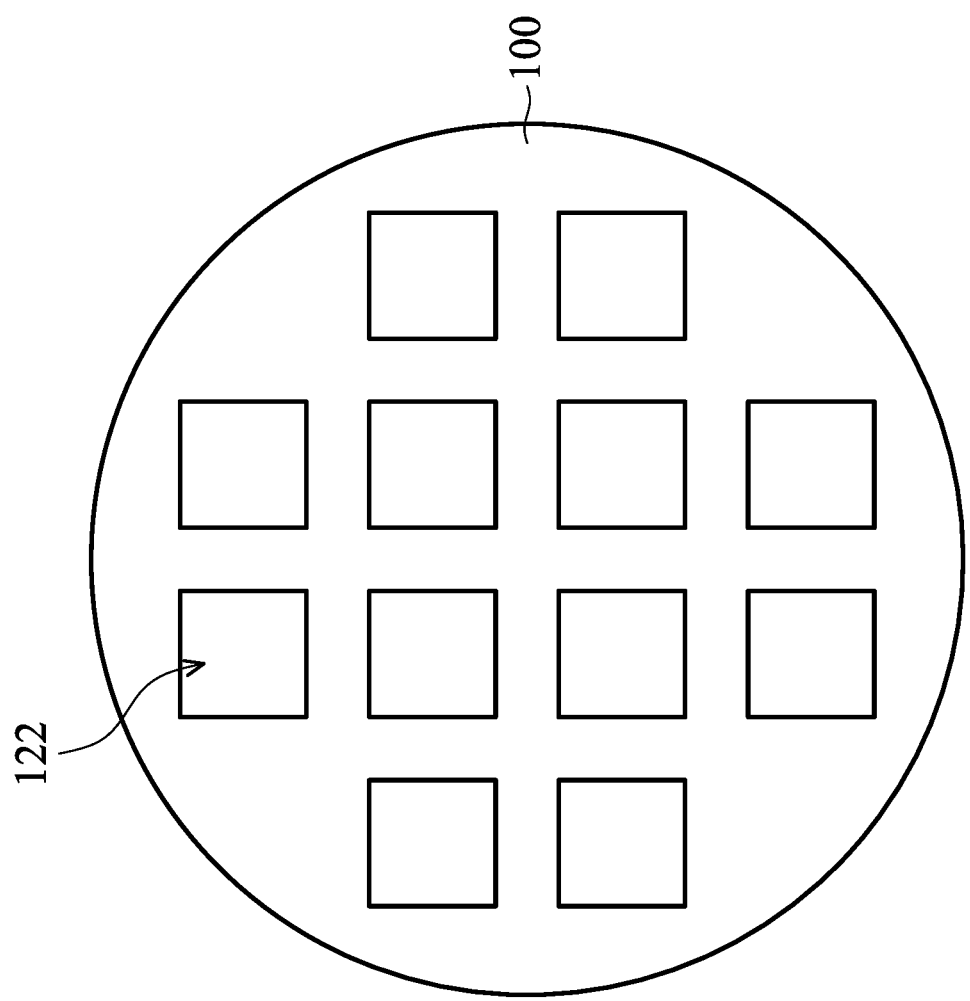

In some embodiments, a mold is used to assist in the formation of the protection layer 124. FIGS. 2A-1 to 2C-1 are cross-sectional views of various stages of a process for forming the protection layer 124 of a chip package, in accordance with some embodiments. FIGS. 2A-2 to 2C-2 are top views of various stages of a process for forming the protection layer 124 a chip package, in accordance with some embodiments.

As shown in FIG. 2A-1, a mold 200 is disposed over the carrier substrate 100, in accordance with some embodiments. In some embodiments, a space 230 is formed between the mold 200 and the carrier substrate 100, as shown in FIG. 2A-1. In some embodiments, the mold 200 includes a sealing element 201. The sealing element 201 may be used to cover the peripheral region of the carrier substrate 100. In some embodiments, the sealing element 201 is a sealing ring. The sealing element 201 may also be used as a settle element that affixes the carrier substrate 100 under the mold 200.

However, many variations and/or modifications can be made to embodiments of the disclosure. In some other embodiments, the sealing element 201 is not formed.

In some embodiments, the mold 200 includes a release film 202. The space 230 is surrounded by the carrier substrate 100, the sealing element 201, and the release film 202. In some embodiments, the release film 202 is made of a material that has a poor adhesion with a molding compound material used for forming the protection layer 124. In some embodiments, the release film 202 is in direct contact with the conductive structures 112A, 112B, 112C, and 112D after the mold 200 is disposed over the carrier substrate 100. In some embodiments, the release film 202 is also in direct contact with the semiconductor dies 122A and 122B.

However, many variations and/or modifications can be made to embodiments of the disclosure. In some other embodiments, the release film 202 is not formed.

In some embodiments, the mold has one or more openings 206. Each of the openings 206 may be used to allow a flow of a molding compound material 204 to be injected into the mold 200. In some embodiments, one or some of the openings 206 are used to allow the flow of the molding compound material 204 to be led out of the mold 200. In some embodiments, each of the openings 206 is used for letting the flow of the molding compound material 204 enter the mold 200. In some other embodiments, the mold 200 has only one opening 206 that allow the flow of the molding compound material 204 to enter the space 230.

There are a number of semiconductor dies 122 disposed over the carrier substrate 100, as shown in FIG. 2A-2 in accordance with some embodiments. As shown in FIGS. 2A-1 and 2A-2, there is no molding compound material injected over the carrier substrate 100 at this stage, in accordance with some embodiments.

Figures 1, 2B:
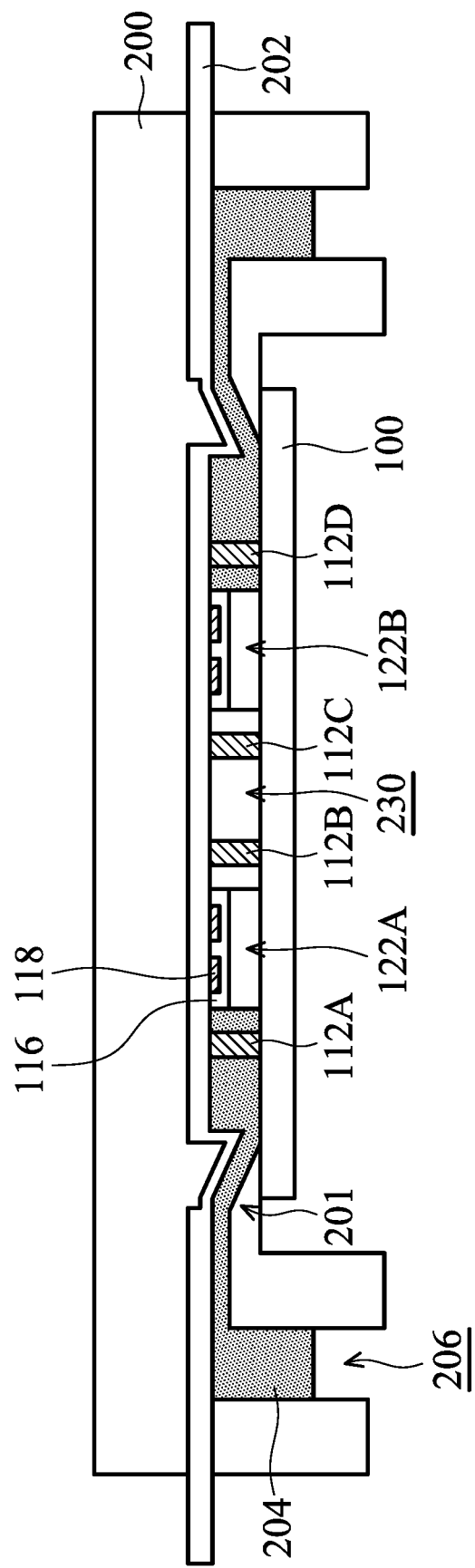
Figures 2, 2B:
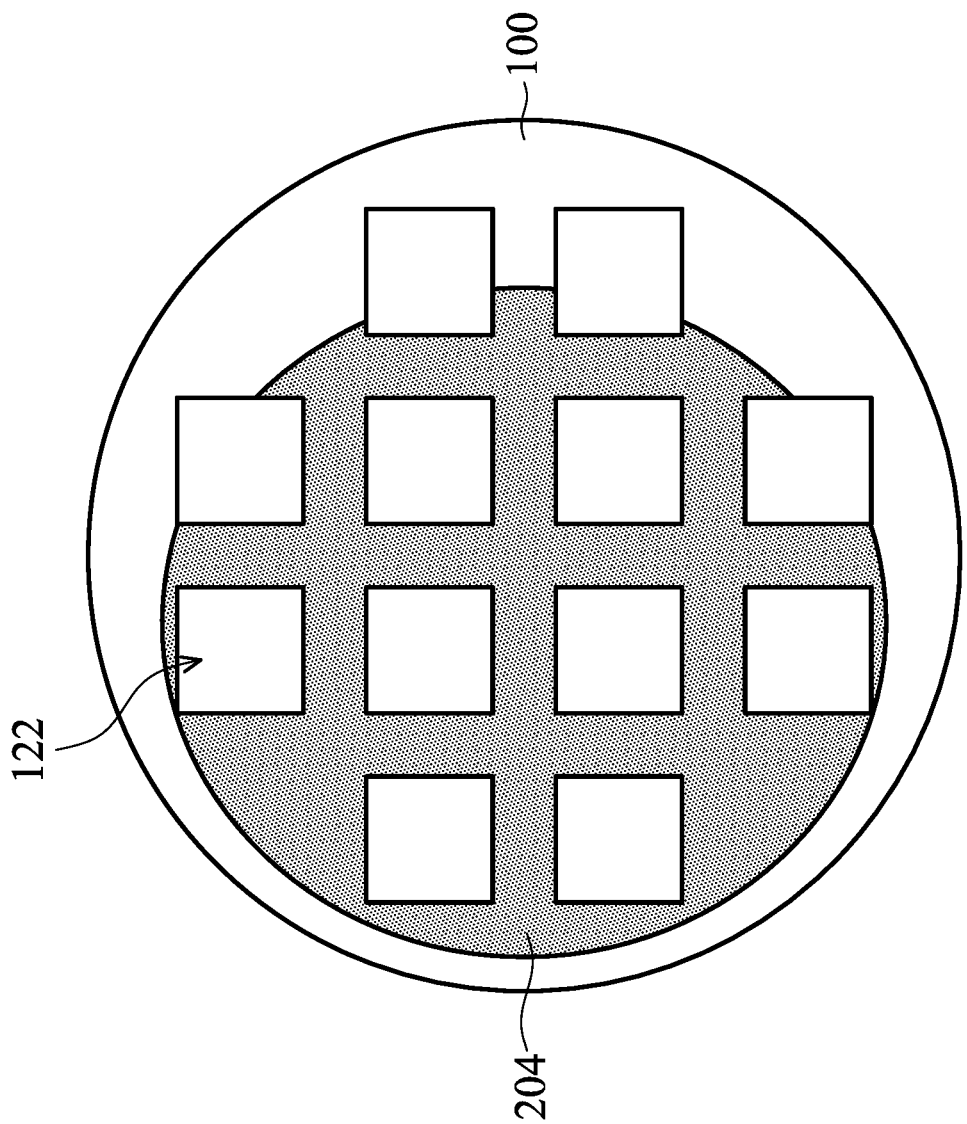
Figures 1, 2C:
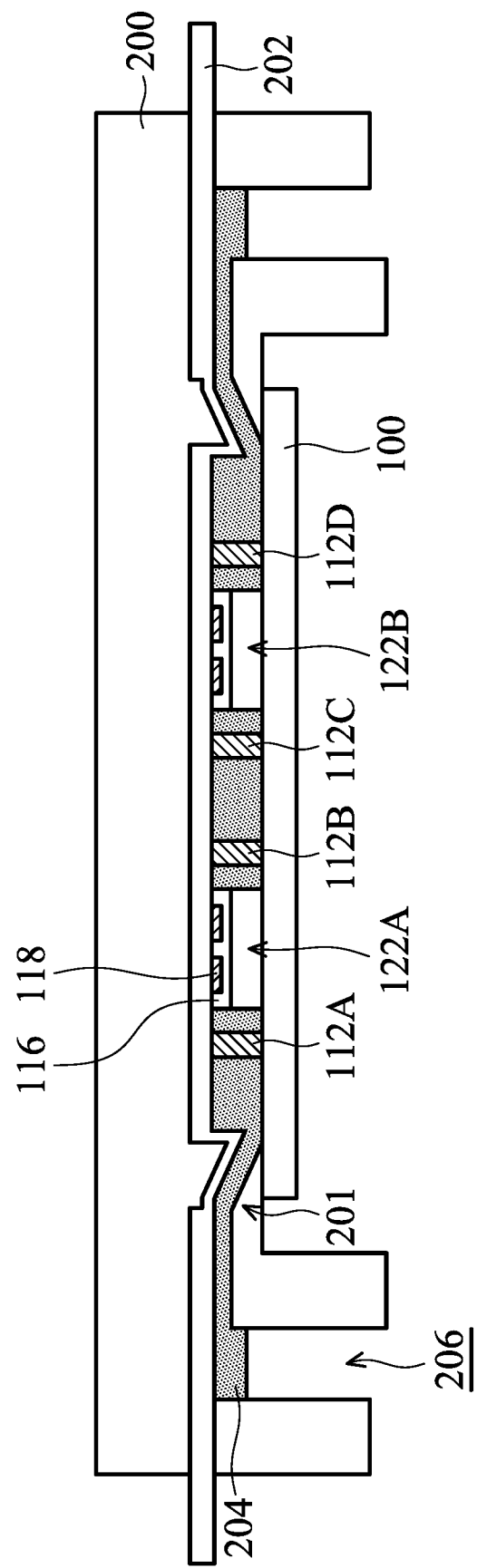
Figures 2, 2C:
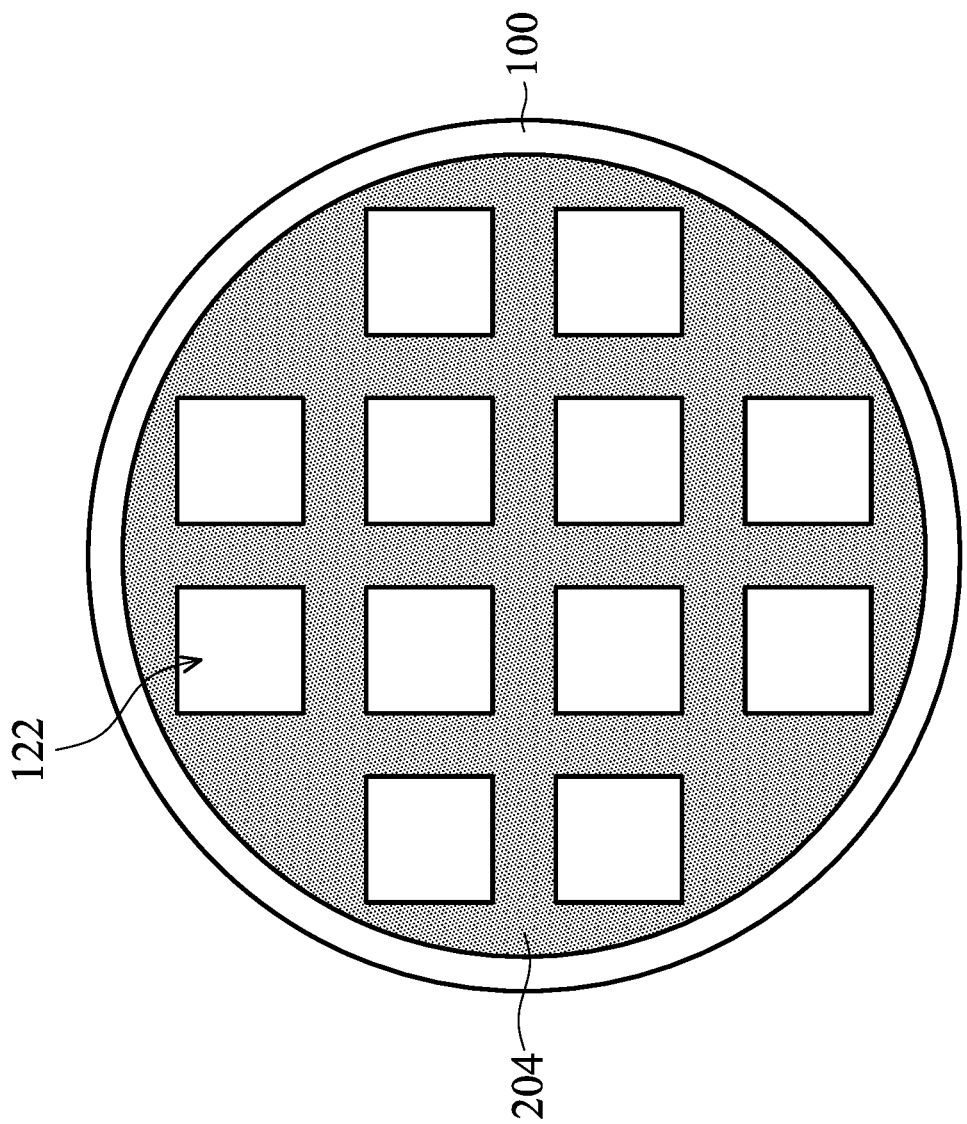

Afterwards, the molding compound material 204 is injected into the space 230 between the mold 200 and the carrier substrate 100, as shown in FIGS. 2B-1 and 2B-2, in accordance with some embodiments. Some of the conductive structures including the conductive structures 112A and 112D are surrounded by the molding compound material 204, as shown in FIG. 2B-1 in accordance with some embodiments. Some of the semiconductor dies 122 including the semiconductor dies 122A and 122B are partially or completely surrounded by the molding compound material 204, as shown in FIGS. 2B-1 and 2B-2 in accordance with some embodiments. In some embodiments, the release film 202 is in direct contact with the conductive structures 112A, 112B, 112C, and 112D during the injecting of the molding compound material 204. In some embodiments, the release film 202 is also in direct contact with the semiconductor dies 122 including the semiconductor dies 122A and 122B during the injecting of the molding compound material 204.

Afterwards, the injected molding compound material 204 completely fills the space 230 between the mold 200 and the carrier substrate 100, as shown in FIGS. 2C-1 and 2C-2, in accordance with some embodiments. In some embodiments, the mold 200 is removed, and the molding compound material 204 is cured to become the protection layer 124, as shown in FIG. 1H. In some embodiments, the molding compound material 204 is cured after the removal of the mold 200. In some other embodiments, the molding compound material 204 is cured before the removal of the mold 200. In some other embodiments, a thermal operation is performed before the removal of the mold 200. Afterwards, another thermal operation is used to complete the curing of the molding compound material 204. As a result, the protection layer 124 is formed.

In some embodiments, during the injecting of the molding compound material 204 for forming the protection layer 124, the molding compound material 204 does not cover the top surfaces of the conducting structures 112A, 112B, 112C, and 112D and/or the semiconductor dies 122A and 122B due to the mold 200. As a result, the top surfaces of the conducting structures 112A, 112B, 112C, and 112D and the semiconductor dies 122A and 122B are not covered by the protection layer 124, as shown in FIG. 1H. In some embodiments, it is not necessary for the protection layer 124 to be thinned since the conductive structures 112A, 112B, 112C, and 112D and the conductive pads 118 of the semiconductor dies 122A and 122B have been exposed without being covered by the protection layer 124.

In some other cases, the mold 200 is not used. In these cases, the conductive structures and the semiconductor dies are covered by the molding compound material. Afterwards, a thinning process may need to be performed to thin down the protection layer so as to expose the conductive structures and the semiconductor dies. An additional passivation layer (such as a PBO layer) and conductive pillars that can sustain the thinning process may need to have been formed previously over each of the semiconductor dies to ensure conductive routes to the semiconductor dies. Fabrication cost and process time are therefore high.

In some embodiments where the mold 200 is used, since no thinning process to the protection layer 124 is required, fabrication cost and process time are reduced. Damage due to the thinning process may also be prevented. In some embodiments, no additional passivation layer or conductive pillars needs to be formed on the semiconductor dies, and so the fabrication cost and process time are reduced further.

In some embodiments, the adhesion between the molding compound material 204 and the release film 202 is poor. Therefore, the molding compound material 204 may be prevented from adhering on the mold during the subsequent removal of the mold 200. After the removal of the mold 200, recesses may be formed at the surface of the molding compound material 204. As a result, there are also some recesses 126 formed at the surface of the protection layer 124 after the molding compound material 204 is cured to form the protection layer 124.

As shown in FIG. 1H, the protection layer 124 has recesses 126, in accordance with some embodiments. Some of the recesses 126 are between the semiconductor die 122A or 122B and one of the conductive structures 112A, 112B, 112C, and 112D. Some of the recesses 126 are between two of the conductive structures, such as between the conductive structures 112B and 112C. As shown in FIG. 1H, one of the recesses 126 has a depth D. In some embodiments, the depth D is in a range from about 3 µm to about 10 µm. For example, the depth D may be about 7 µm.

Afterwards, an interconnection structure including multiple dielectric layers and multiple conductive layers is formed over the structure shown in FIG. 1H. As shown in FIG. 1I, a dielectric layer 128a is formed over the protection layer 124, the conductive structures 112A-112D, and the semiconductor dies 122A and 122B. In some embodiments, the dielectric layer 128a is made of one or more polymer materials. The dielectric layer 128a may be made of polybenzoxazole (PBO), polyimide (PI), another suitable material, or a combination thereof. In some embodiments, the dielectric layer 128a is formed using a spin coating process, a spray coating process, another applicable process, or a combination thereof.

As shown in FIG. 1I, the top surface of the dielectric layer 128a may have a surface morphology similar to that below the dielectric layer 128a. The dielectric layer 128a may also have recesses at positions that correspond to the recesses 126 formed at the surface of the protection layer 124. As shown in FIG. 1I, the dielectric layer 128a may have an uneven top surface.

As shown in FIG. 1I, a cutting tool 199 is provided and will be used to mechanically trim off an upper portion of the dielectric layer 128a to improve the flatness of the dielectric layer 128a, in accordance with some embodiments. For example, an upper portion of the dielectric layer 128a above an imaginary line L' will be cut.

As shown in FIG. 1J, after the dielectric layer 128a is partially cut, the remaining portion of the dielectric layer 128a has a substantially planarized top surface. The dielectric layer 128a with the substantially planarized top surface may facilitate subsequent processes such as a patterning process and a deposition process.

In some embodiments, the surface of the dielectric layer 128a is not perfectly planarized. In some embodiments, there are one or more cutting scratches formed on the surface of the dielectric layer 128a. The cutting scratches may be formed by the partial cutting of the upper portion of the dielectric layer 128a.

Figure 3A:
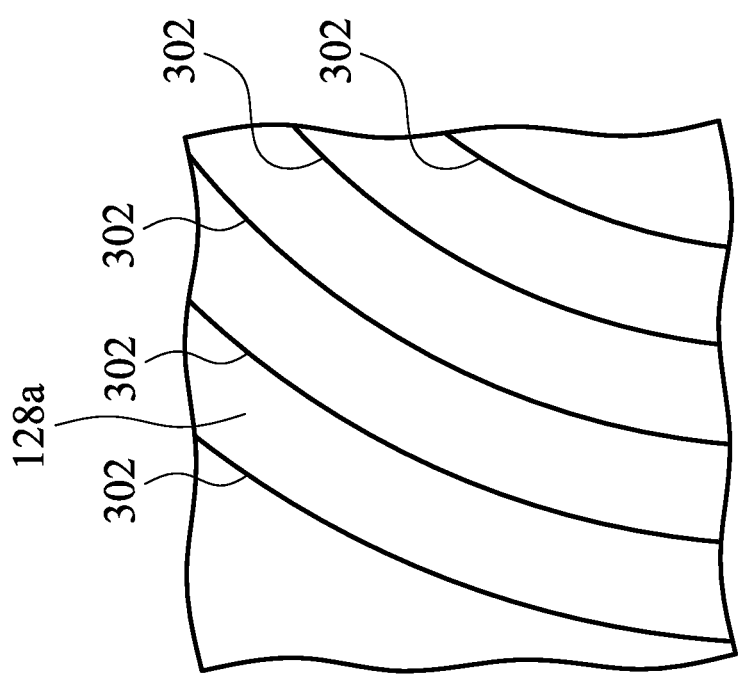
FIG. 3A is a top view of one of various stages of a process for forming a chip package, in accordance with some embodiments.

FIG. 3A is a top view of one of various stages of a process for forming a chip package, in accordance with some embodiments. In some embodiments, FIG. 3A is a top view of the structure shown in FIG. 1J. As shown in FIG. 3A, a number of cutting scratches 302 are formed on the surface of the dielectric layer 128a after being cut by the cutting tool 199. In some embodiments, the structure shown in FIG. 1I is rotated while being cut by the cutting tool 199. As a result, each of the cutting scratches 302 has a curved track. In some embodiments, the structure shown in FIG. 1I is moved towards the cutting tool 199 step by step. For example, after a portion of the dielectric layer 128a is cut by the cutting tool 199 for a predetermined period of time, the structure shown in FIG. 1I is moved towards the cutting tool 199 so that another portion of the dielectric layer 128a is cut. In some embodiments, the intervals between the cutting scratches 302 are substantially the same because the distances between each step while the structure shown in FIG. 1I is moving towards the cutting tool 199 are substantially the same.

As shown in FIG. 1K, the dielectric layer 128a is patterned to form multiple openings 129, in accordance with some embodiments. In some embodiments, one of the openings 129 exposes the conductive structure 112A. In some embodiments, one of the openings 129 exposes conductive features (such as the conductive pads 118) of the semiconductor die 122A. In some embodiments, the openings 129 are formed using a photolithography process, a laser drilling process, another applicable process, or a combination thereof. Although the top surface of the dielectric layer 128a is formed with some cutting scratches 302, the top surface of the dielectric layer 128a is still substantially planar, which may facilitate subsequent patterning processes and/or deposition processes. Therefore, the patterning process for forming the openings 129 becomes easier.

In the embodiments illustrated in FIGS. 1I-1K, the dielectric layer 128a is patterned to form the openings 129 after the upper portion of the dielectric layer 128a is cut for planarization. However, many variations and/or modifications can be made to embodiments of the disclosure. In some other embodiments, the dielectric layer 128a is patterned to form the openings 129 before the upper portion of the dielectric layer 128a is cut for planarization.

Figure 4:
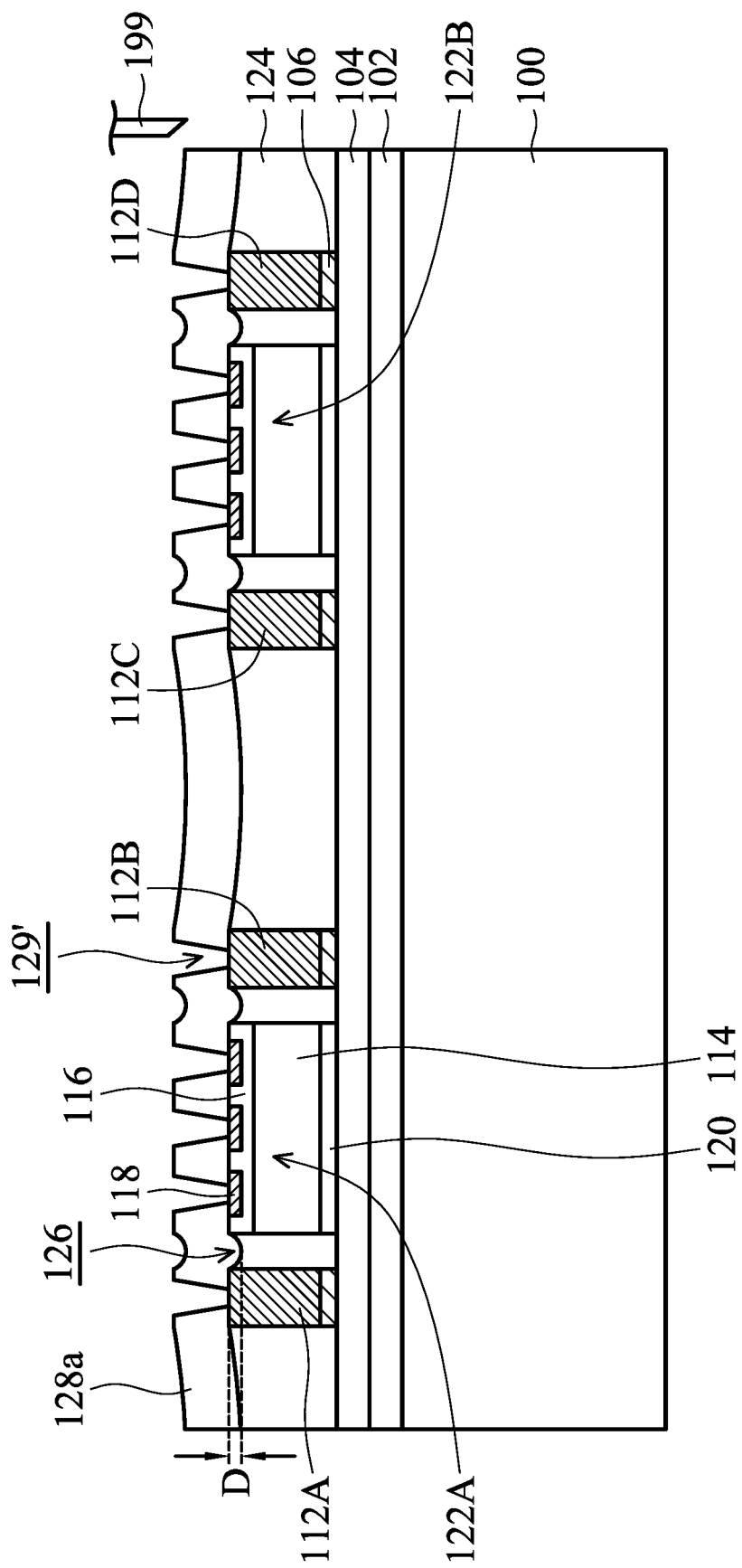
FIG. 4 is a cross-sectional view of one of various stages of a process for forming a chip package, in accordance with some embodiments.

FIG. 4 is a cross-sectional view of one of various stages of a process for forming a chip package, in accordance with some embodiments. In some embodiments, before being planarized, the dielectric layer 128a is patterned to form openings 129'. Some of the openings 129' expose the conductive structures 112A-112D, and some of the openings 129' expose the conductive features (such as the conductive pads 118) of the semiconductor dies 122A and 122B. Afterwards, the cutting tool 199 is used to partially remove the dielectric layer, as shown in FIG. 4 in accordance with some embodiments. As a result, a structure similar to that shown in FIG. 1K is formed.

Afterwards, conductive layers 130a are formed over the dielectric layer 128a, as shown in FIG. 1L in accordance with some embodiments. In some embodiments, the conductive layer 128a fills the opening 129. In some embodiments, one of the conductive layers 130a is electrically connected to the conductive structure 112A through one of the openings 129. In some embodiments, one of the conductive layers 130a is electrically connected to the conductive feature (such as the conductive pad 118) of the semiconductor die 122A through one of the openings 129. In some embodiments, the conductive structure 112A is electrically connected to the conductive pad 118 of the semiconductor die 122A through one of the conductive layers 130a.

Figure 3B:
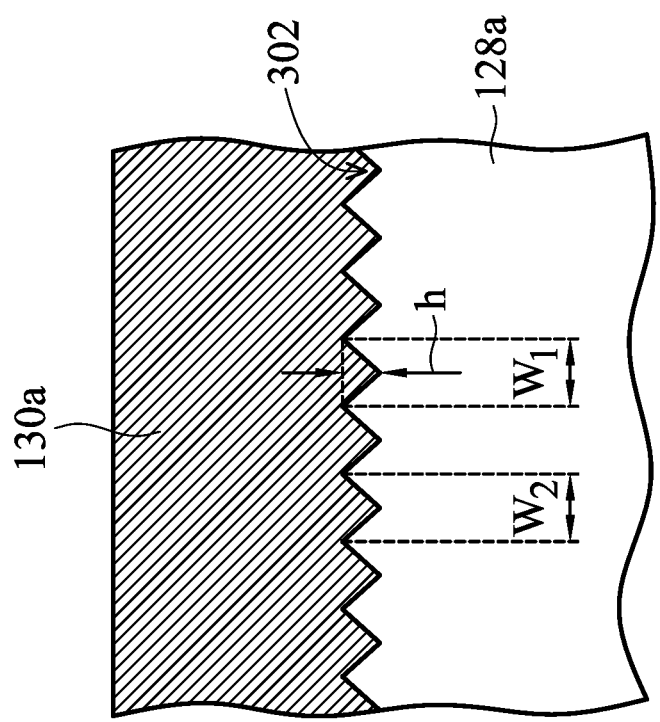
FIG. 3B is a cross-sectional view of one of various stages of a process for forming a chip package, in accordance with some embodiments.

FIG. 3B is a cross-sectional view of one of various stages of a process for forming a chip package, in accordance with some embodiments. In some embodiments, FIG. 3B is an enlarged view near an interface between one of the conductive layers 130a and the dielectric layer 128a. As shown in FIG. 3B, there are a number of cutting scratches 302 formed on the surface of the dielectric layer 128a. In some embodiments, the conductive layers 130a fill some of the cutting scratches (or scoring marks) 302, as shown in FIG. 3B. In some embodiments, the interface between the conductive layers 130a and the dielectric layer 128a has an undulate morphology.

In some embodiments, each of the cutting scratches 302 has a width $W_1$ or $W_2$ that is in a range from about 20 μm to about 60 μm. In some embodiments, the widths $W_1$ and $W_2$ are substantially the same. In some embodiments, each of the cutting scratches 309 has a depth h that is in a range from about 0.05 μm to about 0.1 μm.

As shown in FIG. 1M, a dielectric layer 128b is formed over the dielectric layer 128a and the conductive layers 130a, in accordance with some embodiments. In some embodiments, the material and formation method of the dielectric layer 128b is the same as or similar to those of the dielectric layer 128a. However, embodiments of the disclosure are not limited thereto. In some other embodiments, the dielectric layer 128b is made of a dielectric material different from that of the dielectric layer 128a. In some embodiments, the dielectric layer 128b is made of silicon oxide or the like using a deposition process, such as a chemical vapor deposition (CVD) process.

Figure 3C:
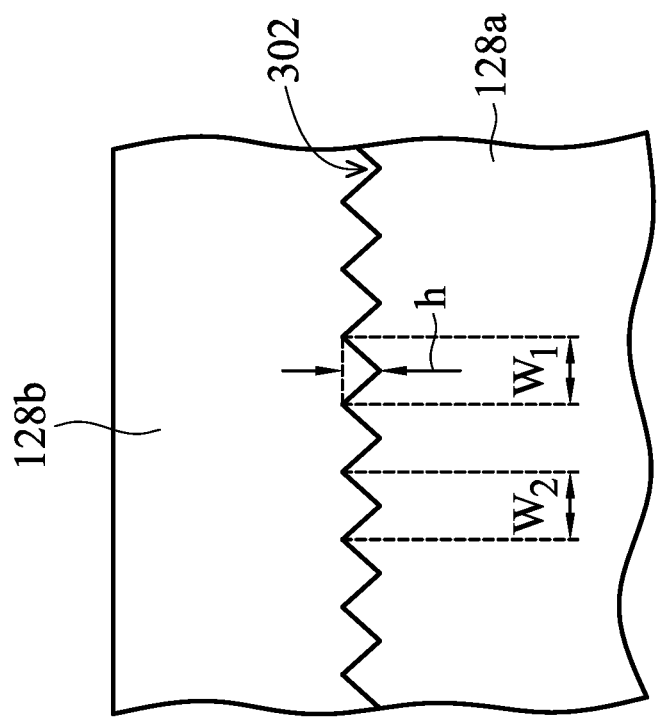
FIG. 3C is a cross-sectional view of one of various stages of a process for forming a chip package, in accordance with some embodiments.

FIG. 3C is a cross-sectional view of one of various stages of a process for forming a chip package, in accordance with some embodiments. In some embodiments, FIG. 3C is an enlarged view near an interface between the dielectric layer 128b and the dielectric layer 128a. In some embodiments, the dielectric layer 128b fills some of the cutting scratches 302, as shown in FIG. 3C. In some embodiments, the interface between the dielectric layer 128b and the dielectric layer 128a has an undulate morphology.

Afterwards, multiple dielectric layers including a dielectric layer 128c and a passivation layer 132 and multiple conductive layers including conductive layers 130b and 130c are formed, as shown in FIG. 1M in accordance with some embodiments. In some embodiments, conductive bumps 134 are formed. An under bump metallurgy (UBM) layer (not shown) may be formed between the conductive bumps 134 and the conductive layers 130c. Because the dielectric layer 128a is cut previously to have a substantially planar top surface, the subsequent formation of elements over the dielectric layer 128a may become easier.

Afterwards, the structure shown in FIG. 1M is placed upside down on a support element, in accordance with some embodiments. Then, the carrier substrate 100 and adhesive layer 102 are removed. Afterwards, a dicing process is performed to separate the structure as shown in FIG. 1M into multiple chip packages, as shown in FIG. 1N in accordance with some embodiments. As a result, a chip package with a fan-out structure is formed.

In some embodiments, one or more elements are stacked on or bonded onto the structure as shown in FIG. 1N before the dicing process. As shown in FIG. 1N, another element 136 is stacked over the structure shown in FIG. 1N, in accordance with some embodiments. The element 136 may include a chip package, a semiconductor die, one or more passive devices, another suitable structure, or a combination thereof.

In some embodiments, conductive connectors 138 are formed between the element 136 and the conductive structures such as the conductive structures 112A and 112B. Electrical connections between the element 136 and the semiconductor die 122A may therefore be established. In some embodiments, the base layer 104 is patterned to form openings that expose the seed layer 106 connecting the conductive structures 112A and 112B. The conductive connectors 138 may be formed in the openings and electrically connected to other conductive features of the element 136. In some embodiments, the conductive connectors include solder bumps, solder balls, conductive pillars, conductive pillars that contain no tin, another suitable structure, or a combination thereof.

Many variations and/or modifications can be made to embodiments of the disclosure. In some embodiments, the element 136 is stacked before the dicing process. In some other embodiments, the element 136 is stacked after the dicing process.

Embodiments of the disclosure form a chip package having a semiconductor die and multiple conductive structures. The conductive structures penetrate through a protection layer (or a molding compound layer) that surrounds the semiconductor die and the conductive structures. A mold is used to assist in the formation of the protection layer. The protection layer may not need to be thinned to expose the conductive structures and/or conductive pads of the semiconductor die. Fabrication cost and process time are significantly reduced. Damage due to the thinning process may also be prevented. Interconnection structure is formed over the protection layer and the semiconductor die for electrical connection. A cutting process is used to provide a dielectric layer of the interconnection structure on the protection layer and the semiconductor die with a substantially planar top surface, which facilitates subsequent formation of other elements including other dielectric layers and other conductive layers. The quality and reliability of the chip package are significantly improved.

In accordance with some embodiments, a method for forming a chip package is provided. The method includes disposing a semiconductor die over a carrier substrate and forming a protection layer over the carrier substrate to surround the semiconductor die. The method also includes forming a dielectric layer over the protection layer and the semiconductor die. The method further includes cutting an upper portion of the dielectric layer to improve flatness of the dielectric layer. In addition, the method includes forming a conductive layer over the dielectric layer after cutting the upper portion of the dielectric layer.

In accordance with some embodiments, a method for forming a chip package is provided. The method includes forming a molding compound layer to surround a semiconductor die and forming a dielectric layer over the molding compound layer and the semiconductor die. The method also includes partially cutting the dielectric layer such that the dielectric layer is substantially planarized. The method further includes forming a conductive layer over the dielectric layer after the dielectric layer is substantially planarized.

In accordance with some embodiments, a chip package is provided. The chip package includes a semiconductor die and a protection layer surrounding the semiconductor die. The chip package also includes a dielectric layer over the semiconductor die and the protection layer, and the dielectric layer has an upper surface with cutting scratches. The chip package further includes a conductive layer over the dielectric layer and filling some of the cutting scratches.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    a semiconductor chip;
    a first dielectric layer over the semiconductor chip and extending across opposite sidewalls of the semiconductor chip, wherein the first dielectric layer has scratches;
    a conductive layer over the first dielectric layer, wherein the conductive layer extends across a first plurality of the scratches; and
    a second dielectric layer over the conductive layer and extending across a second plurality of the scratches, wherein the second dielectric layer extends into the second plurality of the scratches, and bottoms of the second plurality of the scratches are positioned at height levels that are lower than an upper surface of the first dielectric layer.

2. The package structure as claimed in claim 1, wherein the first dielectric layer and the second dielectric layer are made of the same material.

3. The package structure as claimed in claim 1, wherein the conductive layer has a lower surface and an upper surface, the lower surface of the conductive layer is between the upper surface of the conductive layer and the first dielectric layer, and the lower surface of the conductive layer is rougher than the upper surface of the conductive layer.

4. The package structure as claimed in claim 1, wherein the second dielectric layer has a lower surface and an upper surface, the lower surface of the second dielectric layer is between the upper surface of the second dielectric layer and the first dielectric layer, and the lower surface of the second dielectric layer is rougher than the upper surface of the second dielectric layer.

5. The package structure as claimed in claim 1, wherein each of the scratches has a curved top view.

6. The package structure as claimed in claim 1, further comprising a second conductive layer electrically connected to the conductive layer, wherein the second dielectric layer and the second conductive layer together covers a top surface of the conductive layer.

7. The package structure as claimed in claim 1, further comprising a protective layer laterally surrounding the semiconductor chip, wherein the protective layer is in direct contact with the first dielectric layer.

8. The package structure as claimed in claim 7, further comprising a conductive structure laterally surrounded by the protective layer and separated from the semiconductor chip by a portion of the protective layer.

9. The package structure as claimed in claim 8, wherein the conductive layer penetrates through the first dielectric layer to reach the conductive structure.

10. The package structure as claimed in claim 1, wherein bottoms of the first scratches are separated from the semiconductor chip by portions of the first dielectric layer.

11. A package structure, comprising:
a semiconductor chip;
a first dielectric layer over the semiconductor chip;
a conductive layer over the first dielectric layer, wherein the conductive layer has a plurality of first protruding portions extending into the first dielectric layer; and
a second dielectric layer over the first dielectric layer and the conductive layer, wherein the second dielectric layer has a plurality of second protruding portions extending into the first dielectric layer, and each of the first protruding portions and the second protruding portions is thinner than the first dielectric layer.

12. The package structure as claimed in claim 11, wherein one of the first protruding portions is in direct contact with one of the second protruding portions and together form a curved track.

13. The package structure as claimed in claim 11, wherein one of the first protruding portions is in direct contact with one of the second protruding portions.

14. The package structure as claimed in claim 11, further comprising a protective layer laterally surrounding the semiconductor chip, wherein the first dielectric layer is in direct contact with an interface between the semiconductor chip and the protective layer.

15. The package structure as claimed in claim 11, wherein the conductive layer penetrates through the first dielectric layer to be electrically connected to a conductive pad of the semiconductor chip.

16. A package structure, comprising:
a semiconductor chip;
a first dielectric layer over the semiconductor chip;
a conductive layer over the first dielectric layer, wherein the conductive layer has a plurality of protruding portions extending into the first dielectric layer, and a portion of the first dielectric layer is vertically between bottoms of the protruding portions and the semiconductor chip; and
a second dielectric layer over the first dielectric layer and the conductive layer, wherein the second dielectric layer extends across the protruding portions.

17. The package structure as claimed in claim 16, wherein the second dielectric layer has a plurality of second protruding portions extending into the first dielectric layer, and the conductive layer is laterally separated from the second protruding portion.

18. The package structure as claimed in claim 16, wherein the first dielectric layer and the second dielectric layer are made of the same material.

19. The package structure as claimed in claim 16, wherein the first dielectric layer is in direct contact with the second dielectric layer, and the second dielectric layer is in direct contact with the conductive layer.

20. The package structure as claimed in claim 16, further comprising a protective layer laterally surrounding the semiconductor chip, wherein the protruding portions of the conductive layer are higher than the protective layer.

\* \* \* \* \*